US011971741B2

(12) United States Patent
Narasimhan et al.

(10) Patent No.: US 11,971,741 B2
(45) Date of Patent: Apr. 30, 2024

(54) AGING MITIGATION

(71) Applicant: QUALCOMM Incorporated, San Diego, CA (US)

(72) Inventors: Mukund Narasimhan, Bangalore (IN); Murali Krishna Ade, Bangalore (IN); Arun David Arul Diraviyam, Bagmane Constellation Bus. (IN); Mayank Gupta, Bangalore (IN); Boris Dimitrov Andreev, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/396,046

(22) Filed: Aug. 6, 2021

(65) Prior Publication Data

US 2023/0038670 A1 Feb. 9, 2023

(51) Int. Cl.

| | |
|---|---|
| ***G06F 1/10*** | (2006.01) |
| ***G06F 1/12*** | (2006.01) |
| ***G06F 9/30*** | (2018.01) |
| ***G06F 9/54*** | (2006.01) |

(52) U.S. Cl.

CPC .................. *G06F 1/10* (2013.01); *G06F 1/12* (2013.01); *G06F 9/30134* (2013.01); *G06F 9/544* (2013.01)

(58) Field of Classification Search

CPC .......... G06F 1/10; G06F 1/12; G06F 9/30134; G06F 9/544

See application file for complete search history.

(56) References Cited

U.S. PATENT DOCUMENTS 5,583,461 A * 12/1996 Lowe ........................ H03K 5/13 327/172
5,694,056 A * 12/1997 Mahoney ......... H03K 19/17704 326/38
5,724,039 A * 3/1998 Hayashi .................. H03M 1/66
6,657,979 B1 * 12/2003 Patel ........................ H04J 3/047
6,864,726 B2 * 3/2005 Levin ................... H03K 17/165 327/104

(Continued)

FOREIGN PATENT DOCUMENTS

CN 104639042 A * 12/2004
CN 104639042 A * 5/2015

(Continued)

OTHER PUBLICATIONS

International Search Report and Written Opinion—PCT/US2022/036199—ISA/EPO—Oct. 27, 2022.

*Primary Examiner* — Sibin Chen
*Assistant Examiner* — James G Yeaman
(74) *Attorney, Agent, or Firm* — Loza & Loza, LLP

(57) ABSTRACT

Aspects of the present disclosure control aging of a signal path in an idle mode to mitigate aging. In one example, an input of the signal path is alternately parked low and high over multiple idle periods to balance the aging of devices (e.g., transistors) in the signal path. In another example, a clock signal (e.g., a clock signal with a low frequency) is input to the signal path during idle periods to balance the aging of devices (e.g., transistors) in the signal path. In another example, the input of the signal path is parked high or low during each idle period based on an aging pattern.

42 Claims, 26 Drawing Sheets

(56) References Cited

U.S. PATENT DOCUMENTS

| | | | | |
|---|---|---|---|---|
| 7,839,194 | B2 * | 11/2010 | Chang | H03K 5/1565 327/175 |
| 7,958,418 | B2 * | 6/2011 | Pacha | G01R 31/31858 714/729 |
| 8,406,802 | B2 * | 3/2013 | Tiedemann, Jr. | H04W 52/58 455/67.11 |
| 9,071,235 | B2 * | 6/2015 | Ma | H03K 5/14 |
| 9,401,223 | B2 * | 7/2016 | Ziaja | G11C 29/32 |
| 9,500,700 | B1 * | 11/2016 | Wang | G01R 31/31715 |
| 9,606,604 | B1 * | 3/2017 | Butter | G06F 1/3209 |
| 9,966,960 | B2 * | 5/2018 | Westwick | H03K 19/17728 |
| 10,110,229 | B1 * | 10/2018 | Lau | G11C 7/1087 |
| 11,057,070 | B1 * | 7/2021 | Lin | H04L 7/0008 |
| 2002/0039325 | A1 * | 4/2002 | Aizawa | G11C 16/32 365/233.1 |
| 2005/0144492 | A1 * | 6/2005 | Yun | G06F 1/324 713/300 |
| 2008/0170582 | A1 * | 7/2008 | Chih-Chi | H04L 25/14 370/252 |
| 2013/0147526 | A1 * | 6/2013 | Kim | G06F 1/08 327/114 |
| 2014/0126654 | A1 * | 3/2014 | Akita | H04B 3/04 |
| 2014/0286469 | A1 * | 9/2014 | Shibasaki | H04L 7/033 375/373 |

FOREIGN PATENT DOCUMENTS

| | | | | | |
|---|---|---|---|---|---|
| CN | 110619902 | A | * | 9/2018 | |
| CN | 110619902 | A | * | 12/2019 | G11C 11/406 |
| JP | 2005208259 | A | * | 1/2004 | |
| JP | 2005208259 | A | * | 8/2005 | |
| JP | 2012222497 | A | * | 4/2011 | |
| JP | 6639348 | B2 | * | 7/2016 | |
| JP | 6639348 | B2 | * | 2/2020 | G09G 3/3413 |
| SU | 762154 | A1 | * | 11/1978 | |
| SU | 762154 | A1 | * | 9/1980 | |

* cited by examiner

AGING MITIGATION

BACKGROUND

Field

Aspects of the present disclosure relate generally to aging, and, more particularly, to aging mitigation.

Background

A circuit may suffer from aging effects such as bias temperature instability (BTI), which can degrade the performance of the circuit over time. For example, BTI stress in a signal path of the circuit during idle mode can cause a duty-cycle shift in the signal path over time, which can lead to timing issues (e.g., timing violations) in the circuit.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a multiplexer having a first input, a second input, a select input, and an output. The system also includes a signal path having an input and an output, wherein the input of the signal path is coupled to the output of the multiplexer. The system further includes a controller coupled to the second input of the multiplexer and the select input of the multiplexer, wherein the controller has an indicator input. The controller is configured to receive a mode indicator signal at the indicator input, if the mode indicator signal has a first logic value, instruct the multiplexer to select the first input of the multiplexer, and, if the mode indicator signal has a second logic value, instruct the multiplexer to select the second input of the multiplexer, and output a control signal to the second input of the multiplexer, the control signal controlling whether the input of the signal path is parked high or low.

A second aspect relates to a system. The system includes a latching circuit having a signal input, a clock input, a set input, a reset input, and an output. The system also includes a signal path having an input and an output, wherein the input of the signal path is coupled to the output of the latching circuit. The system further includes a controller coupled to the set input and the reset input of the latching circuit, wherein the controller has an indicator input. The controller is configured to receive a mode indicator signal at the indicator input, if the mode indicator signal has a first logic value, de-assert the set input and the reset input, and, if the mode indicator signal has a second logic value, control whether the input of the signal path is parked high or low using the set input and the reset input.

A third aspect relates to a method for aging control. The method includes, in an active mode, inputting a signal to an input of the signal path, and, in an idle mode, controlling aging of the signal path.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Aging effects such as bias temperature instability (BTI) can degrade the performance of a circuit over time. For example, BTI stress in a signal path of the circuit during idle mode can cause a duty-cycle shift in the signal path over time, which can lead to timing issues (e.g., timing violations) in the circuit.

Figure 1A:
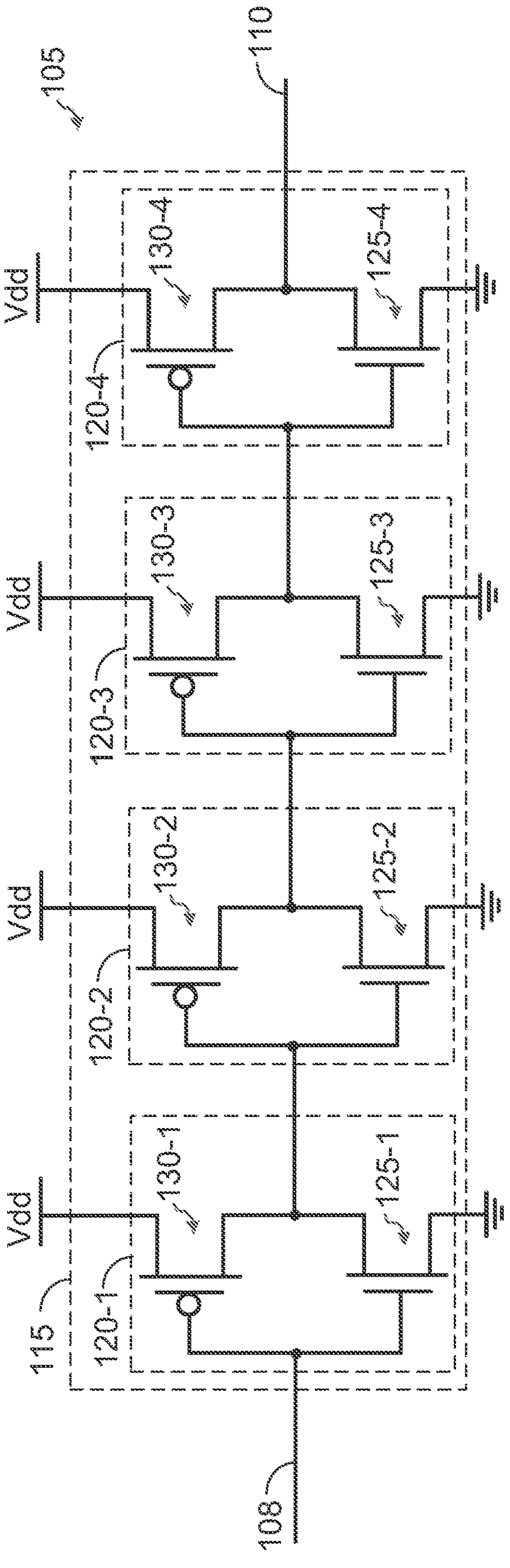
FIG. 1A shows an example of a signal path including a delay circuit according to certain aspects of the present disclosure.

An example of BTI stress induced duty-cycle shift will now be discussed with reference to FIGS. 1A to 1E. FIG. 1A shows an example of a signal path 105 that includes a delay circuit 115 for delaying a signal in the signal path 105. The delay circuit 115 may be configured to delay the signal to adjust the timing of the signal relative to another signal. The signal may be a clock signal, a data signal, a control signal, an address signal, or another type of signal. For the example where the signal is a clock signal, the delay circuit 115 may be used to adjust the timing of the clock signal to center edges of the clock signal between transitions of a data signal for data capture. For the example where the signal is a data signal, the delay circuit 115 may be used to adjust the timing of the data signal to align the data signal with another data signal (e.g., reduce skew between the data signals). For the example where the signal path 105 is in a memory system, the signal may be a control signal including commands for a memory device (e.g., a write command, a read command, a refresh command, etc.) and/or an address signal including an address in the memory device for writing or reading data.

The delay circuit 115 may include delay buffers 120-1 to 120-4 coupled in series, in which the delay of the delay circuit 115 is equal to the sum of the individual delays of the delay buffers 120-1 to 120-4. In the example shown in FIG. 1A, each of the delay buffers 120-1 to 120-4 is implemented with a respective complementary inverter including a respective one of transistors 125-1 to 125-4 (e.g., n-type field effect transistor) and a respective one of transistors 130-1 to 130-4 (e.g., p-type field effect transistor). However, it is to be appreciated that each of the delay buffers 120-1 to 120-4 may be implemented with another type of circuit or logic gate.

When the signal path 105 is in an active mode, a signal (e.g., data signal, clock signal, etc.) is received at the input 108 of the signal path 105 and delayed by the delay of the delay circuit 115. The resulting delayed signal may be output to another circuit (not shown) coupled to the output 110 of the signal path 105.

When the signal path 105 is in an idle mode, the input 108 of the signal path 105 may be parked (i.e., held) high or low for an idle period. For the example where the signal in the active mode is a clock signal, the signal path 105 may be in the idle mode when the clock signal is gated. For the example where the signal in the active mode is a data signal, the signal path 105 may be in the idle mode when there is no data traffic at the input 108 of the signal path 105.

Figure 1B:
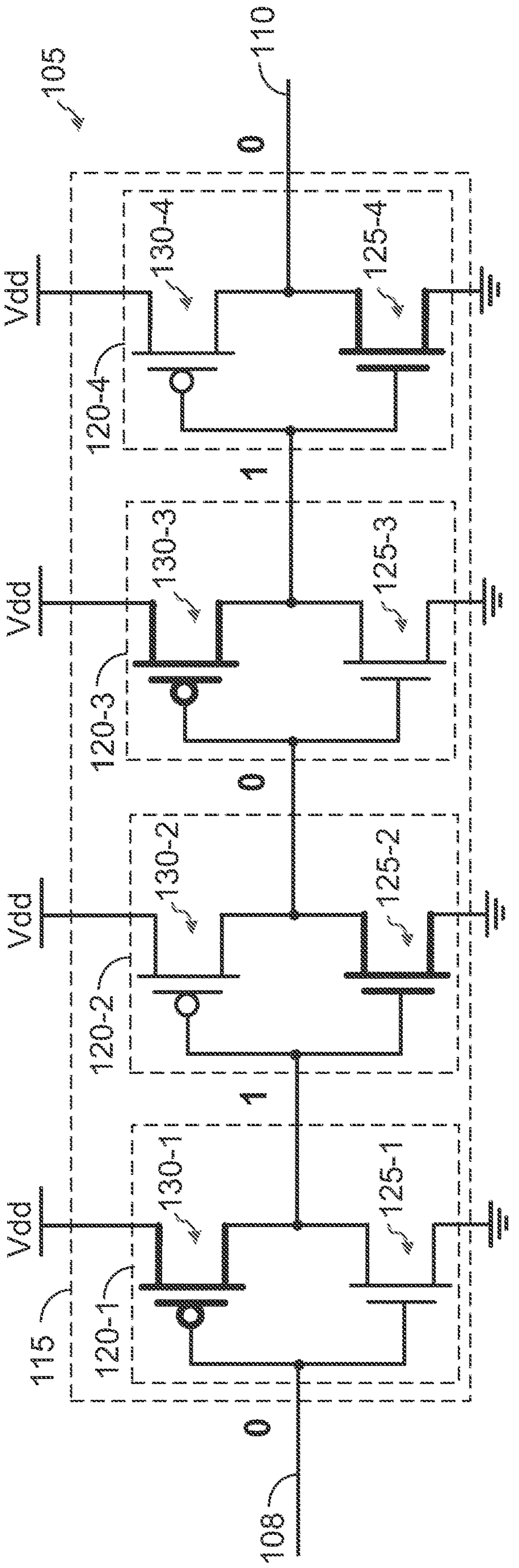
FIG. 1B shows an example in which an input of the signal path is parked low in an idle mode according to certain aspects of the present disclosure.

FIG. 1B shows an example in which the input 108 is parked low (i.e., logic zero) in the idle mode. FIG. 1B also shows the logic states at the input and the output of each of the delay buffers 120-1 to 120-4. In this example, the output 110 of the signal path 105 is low (i.e., logic zero) in the idle mode. In this example, transistors 130-1, 125-2, 130-3, and 125-4 are turned on in the idle mode and transistors 125-1, 130-2, 125-3, and 130-4 are turned off in the idle mode. In FIG. 1B, the transistors 130-1, 125-2, 130-3, and 125-4 that are turned on in the idle mode are shown with thickened lines. The transistors 130-1, 125-2, 130-3, and 125-4 that are turned on in the idle mode are stressed in the idle mode while the transistors 125-1, 130-2, 125-3, and 130-4 that are turned off in the idle mode are not stressed in the idle mode. This leads to asymmetric aging in which the transistors 130-1, 125-2, 130-3, and 125-4 that are stressed in the idle mode age faster than the transistors 125-1, 130-2, 125-3, and 130-4 that are not stressed in the idle mode.

Figure 1C:
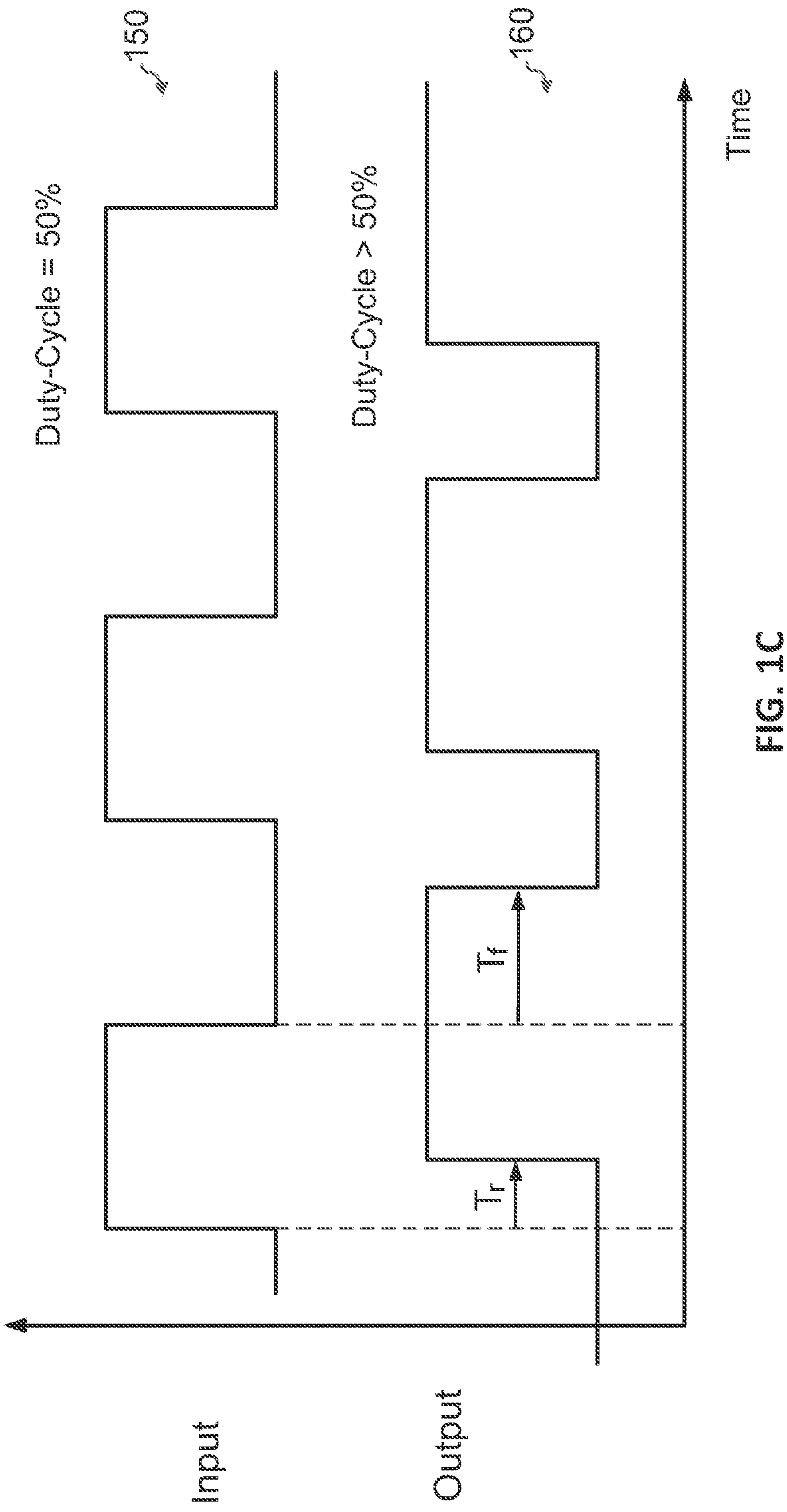
FIG. 1C illustrates an example of a duty-cycle shift in the signal path due to asymmetric aging according to certain aspects of the present disclosure.

In this example, the asymmetric aging shifts the threshold voltages of the transistors 130-1, 125-2, 130-3, and 125-4 that are stressed in the idle mode, causing the falling edge delay at the output 110 to increase relative to the rising edge delay at the output 110. The increase in the falling edge delay relative to the rising edge delay causes a duty-cycle shift in the signal path 105. An example of the duty-cycle shift is illustrated in a timing diagram shown in FIG. 1C. In the example shown in FIG. 1C, a clock signal 150 is input to the input 108 of the signal path 105 in the active mode. In this example, the clock signal 150 at the input 108 has a 50% duty cycle. FIG. 1C also shows the clock signal 160 at the output 110 of the signal path 105 after the clock signal 150 has been delayed by the delay circuit 115. The delay circuit 115 delays a rising edge of the clock signal 160 by delay $T_r$ and delays a falling edge of the clock signal 160 by delay $T_f$ at the output 110. As shown in FIG. 1C, the delay $T_f$ of the falling edge is longer than the delay $T_r$ of the rising edge due to the asymmetric aging. In this example, the longer delay of the falling edge causes the duty cycle of the clock signal 160 at the output 110 to increase (i.e., results in a duty cycle greater than 50% at the output 110).

Figure 1D:
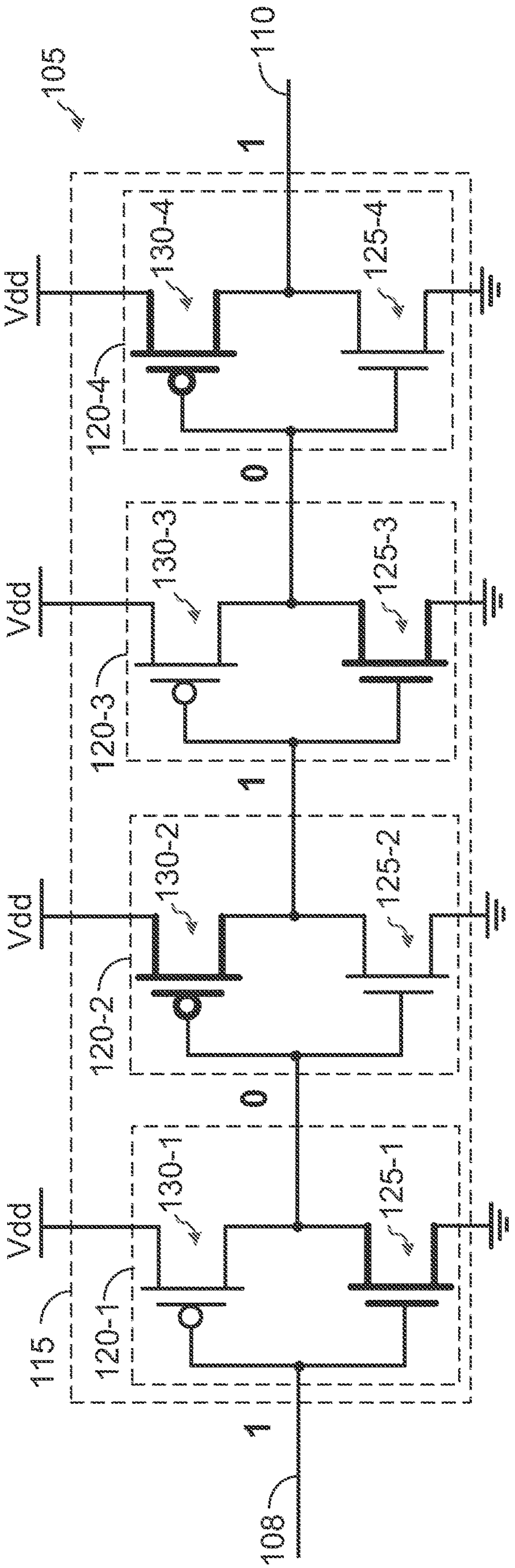
FIG. 1D shows an example in which the input of the signal path is parked high in the idle mode according to certain aspects of the present disclosure.

In the example illustrated in FIGS. 1B and 1C, the input 108 of the signal path 105 is parked low in the idle mode. Asymmetric aging also occurs for the case where the input 108 of the signal path 105 is parked high in the idle mode. In this regard, FIG. 1D shows an example in which the input 108 is parked high (i.e., logic one) in the idle mode. FIG. 1D also shows the logic states at the input and the output of each the delay buffers 120-1 to 120-4. In this example, the output 110 of the signal path 105 is high (i.e., logic one) in the idle mode. In this example, transistors 125-1, 130-2, 125-3, and 130-4 are turned on in the idle mode and transistors 130-1, 125-2, 130-3, and 125-4 are turned off in the idle mode. In FIG. 1D, the transistors 125-1, 130-2, 125-3, and 130-4 that are turned on in the idle mode are shown with thickened lines. The transistors 125-1, 130-2, 125-3, and 130-4 that are turned on in the idle mode are stressed in the idle mode while the transistors 130-1, 125-2, 130-3, and 125-4 that are turned off in the idle mode are not stressed in the idle mode, which leads to asymmetric aging in which the transistors 125-1, 130-2, 125-3, and 130-4 that are stressed in the idle mode age faster than the transistors 130-1, 125-2, 130-3, and 125-4.

Figure 1E:
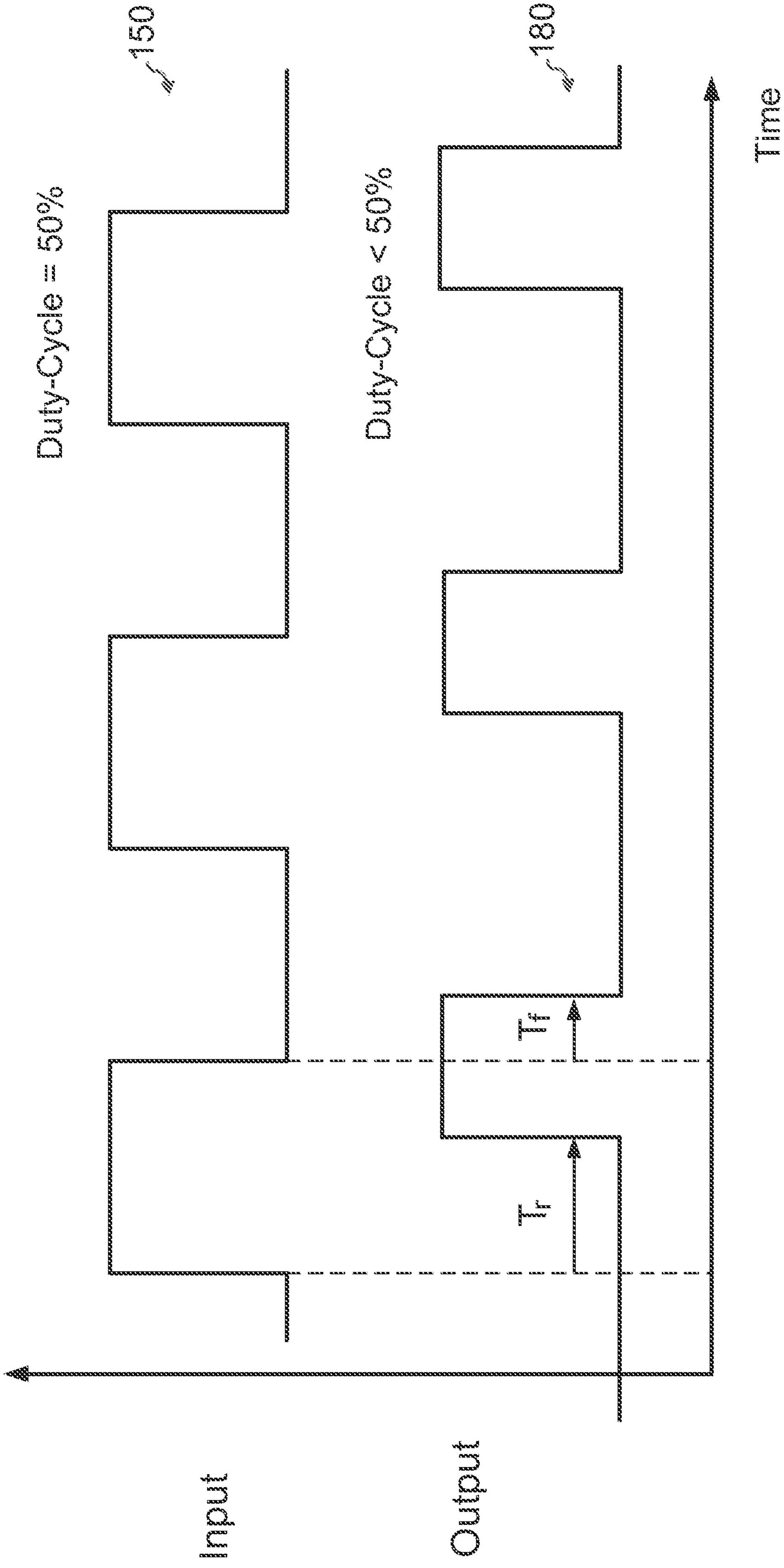
FIG. 1E illustrates another example of a duty-cycle shift in the signal path due to asymmetric aging according to certain aspects of the present disclosure.

In this example, the asymmetric aging shifts the threshold voltages of the transistors 125-1, 130-2, 125-3, and 130-4 that are stressed in the idle mode, causing the rising edge delay at the output 110 to increase relative to the falling edge delay at the output 110. The increase in the rising edge delay relative to the falling edge delay causes a duty-cycle shift in the signal path 105. An example of the duty-cycle shift is illustrated in the timing diagram shown in FIG. 1E. In the example shown in FIG. 1E, the clock signal 150 is input to the input 108 of the signal path 105 in the active mode. In this example, the clock signal 150 at the input 108 has a 50% duty cycle. FIG. 1E also shows the clock signal 180 at the output 110 of the signal path 105 after the clock signal 150 has been delayed by the delay circuit 115. The delay circuit 115 delays a rising edge of the clock signal 180 by delay $T_r$ and delays a falling edge of the clock signal 180 by delay $T_f$ at the output 110. As shown in FIG. 1E, the delay $T_r$ of the rising edge is longer than the delay $T_f$ of the falling edge due to the asymmetric aging. In this example, the longer delay of the rising edge causes the duty cycle of the clock signal 180 at the output 110 to decrease (i.e., results in a duty cycle less than 50% at the output 110).

Thus, asymmetric aging in the idle mode causes a duty-cycle shift (i.e., duty-cycle degradation) over time. The duty-cycle shift increases or decreases the duty cycle depending on whether the input 108 of the signal path 105 is parked low or high in the idle mode. In a duty-cycle sensitive system, the duty-cycle shift can lead to timing issues in the system. An example of such as system is a double data rate (DDR) system in which data is captured from a data signal on both rising edges and falling edges of a clock signal. In this example, duty-cycle shift due to asymmetric aging can lead to timing violations in the system.

To address this, various aspects of the present disclosure control aging in the idle mode to mitigate duty-cycle shift due to aging. In one example, instead of parking the input of a signal path at the same logic value during each idle period, the input is alternately parked low and high over multiple idle periods to balance the aging of devices (e.g., transistors) in the signal path, and thus mitigate duty-cycle shift due to asymmetric aging. In another example, a clock signal (e.g., a slow clock signal with a low frequency) is input to the signal path during idle periods to balance the aging of devices (e.g., transistors) in the signal path. In another example, the input of the signal path may be parked high or low during each idle period based on an aging pattern (e.g., a programmable aging pattern). In certain aspects, the aging pattern may be programmed to compensate for asymmetric aging of the signal path in the active mode. In certain aspects, a multiplexer coupled to the input of the signal path is used to control aging of the signal path in the idle mode. In certain aspects, a latching circuit (e.g., flip-flop) coupled to the input of the signal path is used to control aging of the signal path in the idle mode. In certain aspects, the logic value at the input of the signal path in the idle mode may be controlled using a set input and/or a reset input of the latching circuit. The above exemplary features and other exemplary features of the present disclosure are discussed further below.

As used herein, a "latching circuit" includes one or more circuits configured to latch/store one or more logic values, such latches, flip-flops, registers, etc.

Figure 2:
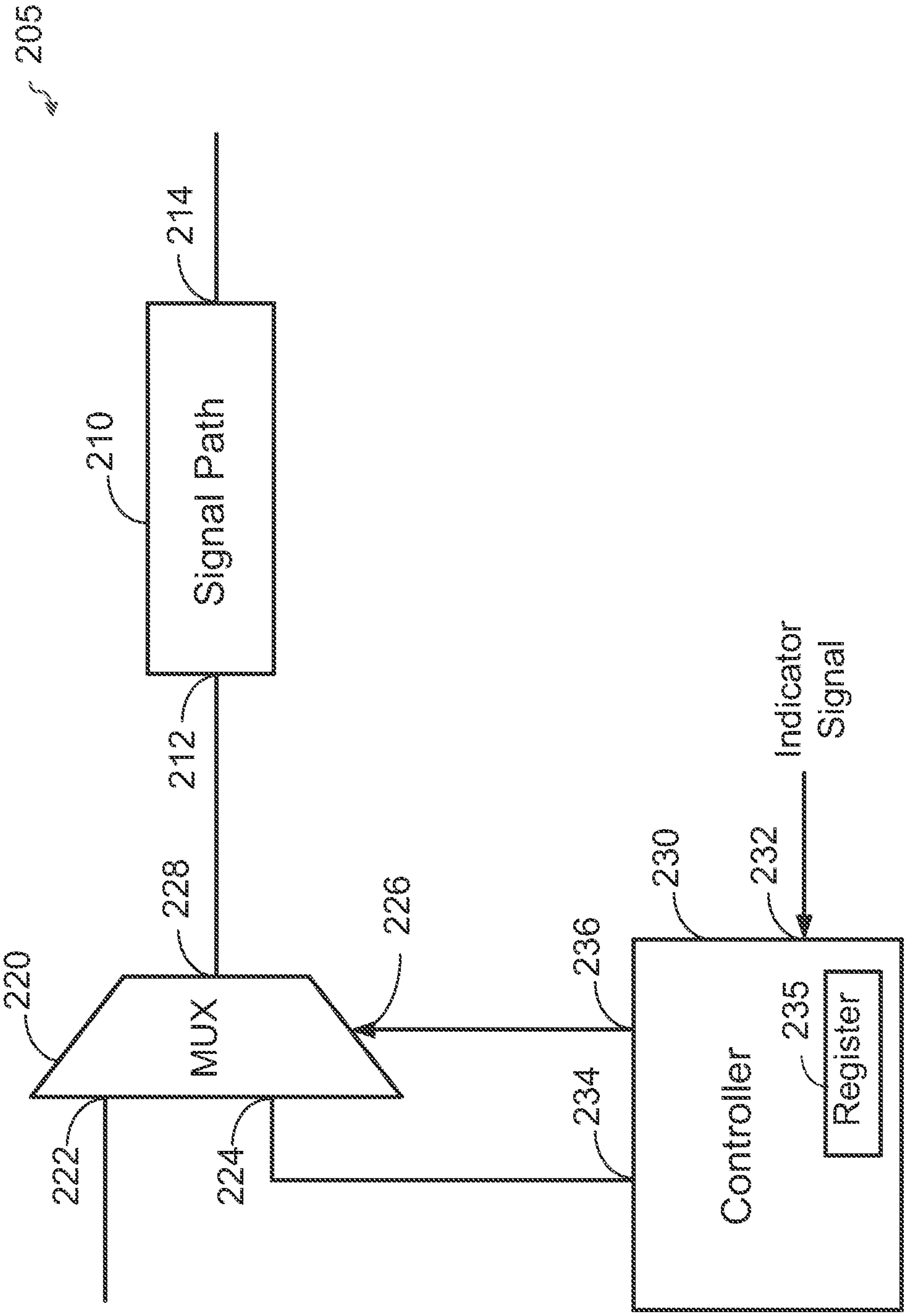
FIG. 2 shows an example of a system including a multiplexer with aging control according to certain aspects of the present disclosure.

FIG. 2 shows an example of a system 205 with aging mitigation according to certain aspects of the present disclosure. In this example, the system 205 includes a signal path 210, a multiplexer 220, and a controller 230.

The signal path 210 has an input 212 and an output 214. The input 212 may be configured to receive a signal in the active mode. The signal may be a clock signal, a data signal, a control signal, an address signal, or another type of signal. The signal path 210 may include a delay circuit (e.g., delay circuit 115) for delaying the signal. For example, the delay circuit may be configured to delay the signal to adjust the timing of the signal relative to another signal, as discussed further below. It is to be appreciated that the signal path 210 may include one or more other circuits instead of or in addition to the delay circuit. The one or more other circuits may include one or more logic gates, a sequential logic circuit, etc. The output 214 of the signal path 210 may be coupled to a sequential logic circuit, a driver, a pad, or another circuit, as discussed further below.

The multiplexer 220 has a first input 222, a second input 224, a select input 226, and an output 228. The output 228 of the multiplexer 220 is coupled to the input 212 of the signal path 210. The multiplexer 220 is configured to selectively couple the first input 222 or the second input 224 to the output 228 based on a select signal received at the select input 226. For example, the multiplexer 220 may couple the first input 222 to the output 228 (i.e., select the first input 222) when the select signal has a first logic value, and couple the second input 224 to the output 228 (i.e., select the second input 224) when the select signal has a second logic value. The first logic value may be one and the second logic value may be zero, or vice versa. In this example, the first input 222 is configured to receive the signal for the active mode of the signal path 210. As discussed above, the signal may be a clock signal, a data signal, a control signal (also referred to as a command signal), an address signal, or another type of signal. Although the multiplexer 220 is shown with two inputs in FIG. 2 (i.e., the first input 222 and the second input 224), it is to be appreciated that the multiplexer 220 may include more than two inputs.

The controller 230 has an input 232, a first output 234, and a second output 236. The input 232 may be configured to receive an indicator signal that indicates to the controller 230 whether the signal path 210 is in an idle mode or an active mode. In this regard, the input 232 may be referred to as an indicator input. In one example, the indicator signal may have a first logic value to indicate the idle mode and a second logic value to indicate the active mode. The first logic value may be one and the second logic value may be zero, or vice versa.

For the example where the signal input to the signal path 210 is a clock signal, the clock signal may be gated in the idle mode. In this example, the indicator signal may be generated by a circuit (not shown) that controls clock gating in the system 205. In this example, the idle indicate signal may indicate the active mode when the clock signal is not gated and indicate the idle mode when the clock signal is gated. For the example where the signal input to the signal path 210 is a data signal, the signal path 210 may enter the idle mode when there is no incoming data traffic to the signal path 210. In this example, the indicator signal may be generated by a circuit (not shown) that controls (e.g., manages) data traffic in the system 205. In this example, the indicate signal may indicate the active mode when there is incoming data traffic and indicate the idle mode when there is no incoming data traffic. For the example where the signal is a control signal (also referred to as a command signal), the signal path 210 may be idle when there is no incoming command (e.g., read/write command) to the signal path 210. In this example, the indicate signal may indicate the active mode when there is incoming command and indicate the idle mode when there is no incoming command.

The first output 234 of the controller 230 is coupled to the second input 224 of the multiplexer 220, and the second output 236 of the controller 230 is coupled to the select input 226 of the multiplexer 220. The controller 230 is configured to output an aging control signal at the first output 234. As discussed further below, the aging control signal controls is a control signal that controls whether the input 212 of the signal path 210 is parked high or low in the idle mode. The controller 230 is configured to output a select signal at the second output 236 to control the input selection of the multiplexer 220.

In the active mode (also referred to as functional mode), the controller 230 instructs the multiplexer 220 to select the first input 222 using the select signal (e.g., sets the select signal to the first logic value). As a result, the multiplexer 220 passes the signal received at the first input 222 to the input 212 of the signal path 210. In one example, the controller 230 may instruct the multiplexer 220 to select the first input 22 when indicator signal indicates the active mode. As discussed above, the signal may be a clock signal, a data signal, a control signal, an address signal, or another type of signal. For the example where the signal is a data signal, the signal path 210 may be in the active mode when the signal path 210 is receiving incoming data traffic. For the example where the signal is a control signal, the signal path 210 may be in the active mode when the signal path 210 is receiving commands (e.g., read/write commands).

In the idle mode, the controller 230 instructs the multiplexer 220 to select the second input 224 (e.g., sets the select signal to the second logic value). For example, the controller 230 may instruct the multiplexer 220 to select the second input 224 when the controller 230 receives the indicator signal indicating the idle mode. As a result, the multiplexer 220 couples the aging control signal output from the first output 234 of the controller 230 to the input 212 of the signal path 210. This allows the controller 230 to control the aging of the signal path 210 in the idle mode by controlling the parked logic value (i.e., state) at the input 212 of the signal path 210 using the aging control signal, as discussed further below.

Figure 3A:
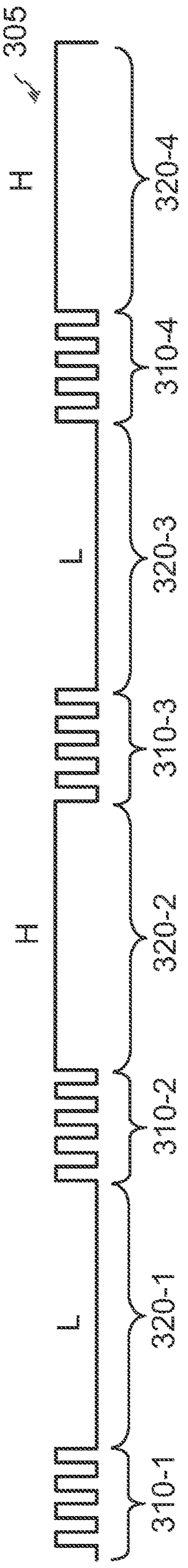
FIG. 3A is a timing diagram illustrating an example of aging control according to certain aspects of the present disclosure.

FIG. 3A is a timing diagram illustrating an example in which the controller 230 controls aging in the idle mode using the aging control signal according to certain aspects. FIG. 3A shows the logic value 305 (i.e., state) at the input 212 of the signal path 210 over multiple active periods 310-1 to 310-4 and multiple idle periods 320-1 to 320-4. In this example, the signal input to the signal path 210 in the active mode is a clock signal. However, it is to be appreciated that the signal may be a data signal, a control signal, an address signal, or another type of signal.

In the example shown in FIG. 3A, the controller 230 alternately parks the input 212 of the signal path 210 low and high over the idle periods 320-1 to 320-4 to balance the aging of devices (e.g., transistors) in the signal path 210. For example, the controller 230 may alternately park the input 212 of the signal path 210 low and high over consecutive idle periods by alternately setting the aging control signal low and high over the consecutive idle periods. The controller 230 may park the input 212 of the signal path 210 low during odd idle periods 320-1 and 320-3 and park the input 212 of the signal path 210 high during even idle periods 320-2 and 320-4 (as shown in the example in FIG. 3A), or park the input 212 of the signal path 210 high during odd idle periods 320-1 and 320-3 and park the input 212 of the signal path 210 low during even idle periods 320-2 and 320-4. To do this, the controller 230 may set the aging control signal low during odd idle periods 320-1 and 320-3 and set the aging control signal high during even idle periods 320-2 and 320-4, or set the aging control signal high during odd idle periods 320-1 and 320-3 and set the aging control signal low during even idle periods 320-2 and 320-4.

Assuming the accumulative duration of the odd idle periods 320-1 and 320-3 is approximately equal to the accumulative duration of the even idle periods 320-2 and 320-4 over many idle periods, the controller 230 parks the input 212 of the signal path 210 low and high for approximately equal durations in the idle mode over time. This helps balance the aging of the devices (e.g., transistors) in the signal path 210, and therefore reduces duty-cycle shift in the signal path 210 caused by asymmetric aging.

Figure 3B:
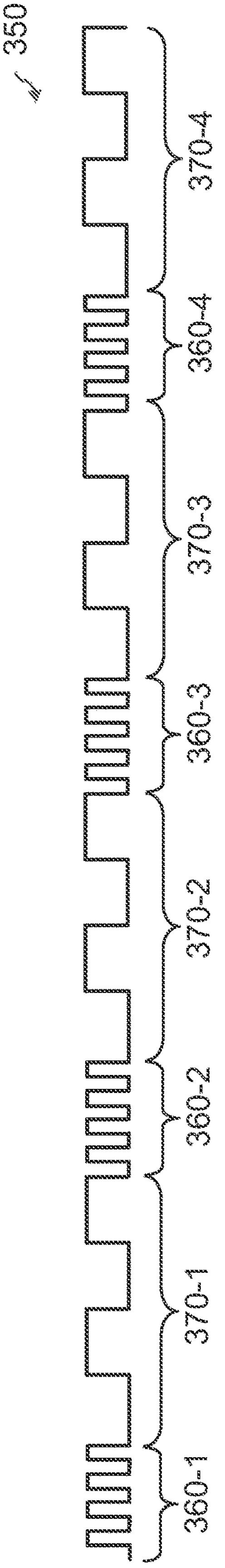
FIG. 3B is a timing diagram illustrating another example of aging control according to certain aspects of the present disclosure.

FIG. 3B is a timing diagram illustrating another example in which the controller 230 controls aging in the idle mode using the aging control signal according to certain aspects. FIG. 3B shows the logic value 350 (i.e., state) at the input 212 of the signal path 210 over multiple active periods 360-1 to 360-4 and multiple idle periods 370-1 to 370-4. In this example, the signal input to the signal path 210 in the active mode is a clock signal. However, it is to be appreciated that the signal may be a data signal or another type of signal.

In the example shown in FIG. 3B, the controller 230 inputs a slow clock signal to the signal path 210 in the idle mode. The slow clock signal may have a much lower frequency than the frequency of the clock signal used in the active mode to reduce power in the idle mode. For example, the slow clock signal may have a frequency of 19.2 MHz or less. The slow clock signal may be generated by a slow clock generator (not shown) coupled to the controller 230. The slow clock generator may be implemented with a crystal oscillator, or another type of clock generator. In this example, the controller 230 may input the slow clock signal to the signal path 210 by outputting the slow clock signal as the aging control signal in the idle mode (i.e., outputting the slow clock signal at the first output 234). In this example, the slow clock signal helps balance the aging of devices (e.g., transistors) in the signal path 210 by alternating the input 212 of the signal path 210 between high and low in the idle mode.

In certain aspects, the controller 230 may park the input 212 of the signal path 210 in the idle mode based on an aging pattern, which may be programmable. For example, the aging pattern may be repeated for each N consecutive idle periods, where N is an integer. For each N consecutive idle periods, the aging pattern may indicate a number k of the N consecutive idle periods in which the input 212 of the signal path 210 is parked high and a number (i.e., N-k) of the N consecutive idle periods in which the input 212 of the signal path 210 is parked low. For example, if N equals 8, then the aging pattern is repeated for each 8 consecutive idle periods. In this aspect, the controller 230 may control aging based on the aging pattern by setting the aging control signal high for k of the N consecutive idle periods and setting the aging control signal low for N-k of the N consecutive idle periods. N may be an integer greater than one, k may be an integer equal to or greater than one, and N may be greater than k. In one example, k and N may be stored as parameters in a register 235 in the controller 230. In this example, k and N may be programmable by writing the values fork and N in the register 235. It is to be appreciated that the register 235 may be omitted in some implementations.

In certain aspects, the aging pattern is specified by a sequence of N bits. In these aspects, each bit in the sequence corresponds to one of the N consecutive idle periods and each bit indicates whether the input 212 of the signal path 210 is parked high or low during the corresponding one of the N consecutive idle periods. For example, a bit value of one may indicate that that the input 212 of the signal path 210 is parked high during the corresponding idle period and a bit value of zero may indicate that the input 212 of the signal path 210 is parked low during the corresponding idle periods, or vice versa. For example, an aging pattern given by the bit sequence 11100000 may indicate that the input 212 is parked high for three of 8 consecutive idle periods and parked low for five of the 8 consecutive idle periods.

In certain aspects, the controller 230 may control aging based on the sequence of N bits by setting the logic state (i.e., logic value) of the aging control signal based on the sequence of N bits, where each bit in the sequence corresponds to a respective one of N consecutive idle periods. For each of the N idle periods, the controller 230 may set the aging control signal high if the corresponding bit in the sequence has a first logic value and set the aging control signal low if the corresponding bit in the sequence has a second logic value. The first logic value may be one and the second logic value may be zero, or vice versa.

Figure 4:
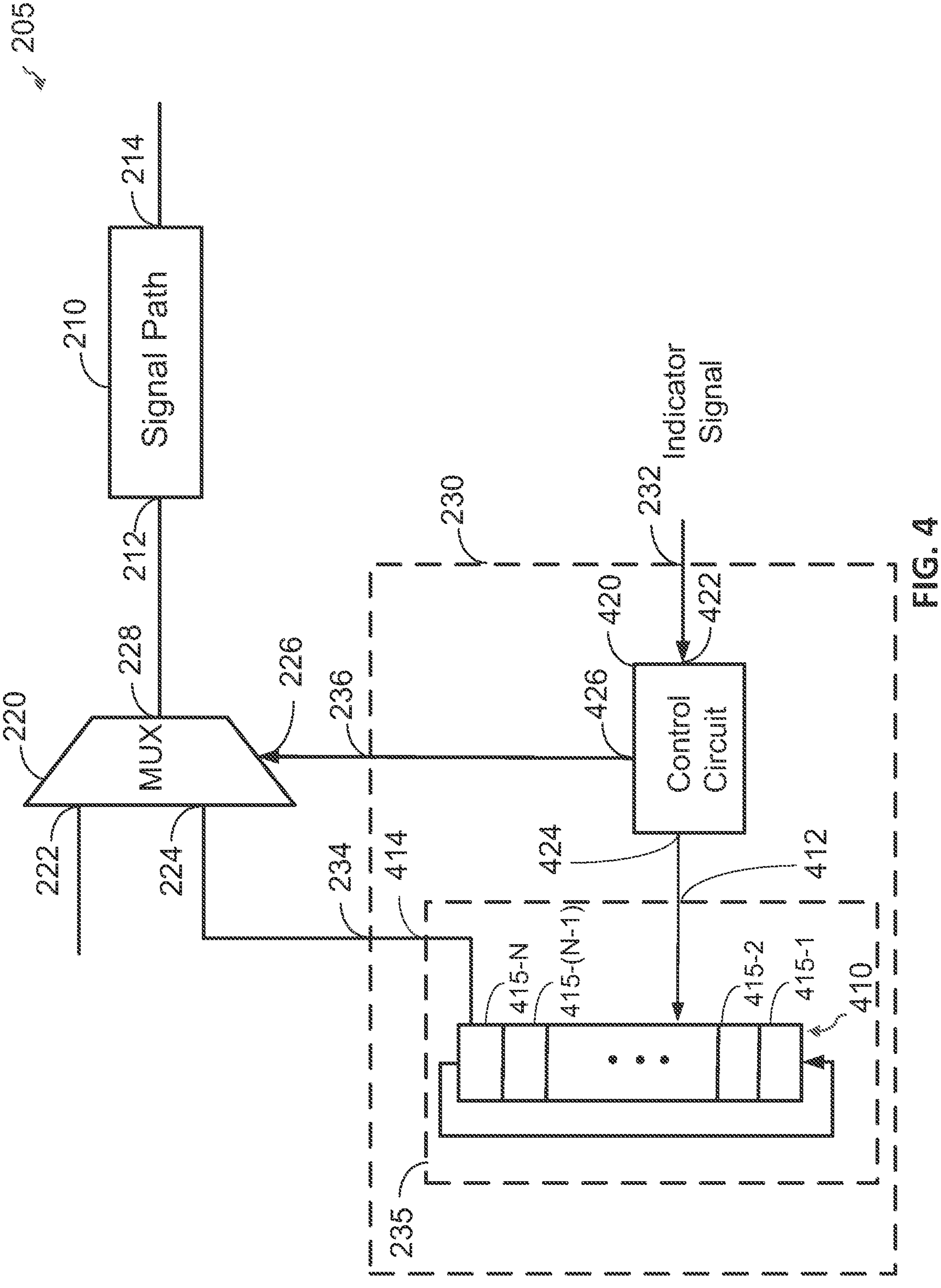
FIG. 4 shows an example of a controller including a circular shift register according to certain aspects of the present disclosure.

The controller 230 may store the sequence of N (e.g., 8) bits specifying the aging pattern in the register 235. In one example, the register 235 may include a circular shift register configured to output one of the bits in the sequence at a time. In this regard, FIG. 4 shows an example in which the register 235 includes a circular shift register 410 according to certain aspects. In this example, the circular shift register 410 includes storage slots 415-1 to 415-N (also referred to as storage spaces), where each of the storage slots 415-1 to 415-N may hold one bit of the sequence of N bits. The circular shift register 410 has an input 412 and an output 414. The input 412 is used to control the shifting of bits in the circular shift register 410, as discussed further below. The output 414 is coupled to the first output 234 of the controller 230 and is configured to output the bit in storage slot 415-N.

In this example, the controller 230 also includes a control circuit 420. The control circuit 420 has an input 422, a first output 424, and a second output 426. The input 422 is coupled to the input 232 of the controller 230 and is configured to receive the indicator signal discussed above. The first output 424 is coupled to the input 412 of the circular shift register 410 and is used by the control circuit 420 to shift the bits in the circular shift register 410, as discussed further below. The second output 426 is coupled to the second output 236 of the controller 230 and is used by the control circuit 420 to control the input selection of the multiplexer 220.

In operation, the control circuit 420 is configured to instruct the multiplexer 220 to select the second input 224 in the idle mode via the second output 426 (e.g., when an idle signal indicating an idle period is received at the input 422). For the example in which the multiplexer 220 selects the second input 224 when the second logic value is input to the select input 226, the control circuit 420 may instruct the multiplexer 220 to select the second input 224 by outputting the second logic value to the select input 225 via the second output 426. The control circuit 420 may be configured to instruct the multiplexer 220 to select the first input 222 in the active mode via the second output 426.

In the idle mode, the control circuit 420 may be configured to shift the bits in the circular shift register 410 by one bit position for each idle period via the first output 424 such that the circular shift register 410 outputs each bit in the sequence of N bits once every N idle periods. For example, the control circuit 420 may shift the bits in the circular shift register 410 by one bit position each time the indicator signal indicates the idle mode. For each shift, the bit in each storage slot 415-1 to 415-N may be shifted up to the next storage slot 415-1 to 415-N in the circular shift register 410. For example, in one shift, the bit in storage slot 415-1 may be shifted up to storage slot 415-2, and the bit in storage slot 415-N may be shifted back to storage slot 415-1 (as indicated by the arrow looping back from storage slot 415-N to storage slot 415-1).

Thus, in this example, the bits in the circular shift register 410 are shifted by one bit position for each idle period such that the circular shift register 410 cycles through the sequence of N bits once every N idle periods. In this example, the input 212 of the signal path 210 may be parked high when the circular shift register 410 outputs a first bit value and the input 212 of the signal path 210 may be parked low when the circular shift register 410 outputs a second bit value. The first bit value may be one and the second bit value may be zero, or vice versa.

Thus, the aging control by the controller 230 can be configured (e.g., programmed), for example, by programming the bits in the sequence of N bits accordingly. In some use cases, the signal path 210 may experience asymmetric aging in the active mode. In these use cases, the aging pattern may be programmed to compensate for the asymmetric aging of the signal path 210 in the active mode, and therefore mitigate duty-cycle shift caused by the asymmetric aging in the active mode. For example, if the input 212 of the signal path 210 is high for a longer duration in the active mode than low in the active mode, then the aging pattern may be programmed such that the controller 230 parks the input 212 of the signal path 210 low for more idle periods than high in order to compensate for the asymmetric aging in the active mode. Similarly, if the input 212 of the signal path 210 is low for a longer duration in the active mode than high in the active mode, then the aging pattern may be programmed such that the controller 230 parks the input 212 of the signal path 210 high for more idle periods than low in order to compensate for the asymmetric aging in the active mode. In this example, the duration that the input 212 of the signal path 210 is high and low in the active mode may be determined, for example, by running a simulation of the system 205 in the active mode. This information may also be obtained by monitoring the logic state at the input 212 of the signal path 210 in the active mode and determining the duration that the input 212 of the signal path 210 is high and low in the active mode based on the monitored logic state. After this information is obtained, the aging pattern may be programmed accordingly to compensate for asymmetric aging in the active mode.

Figure 5A:
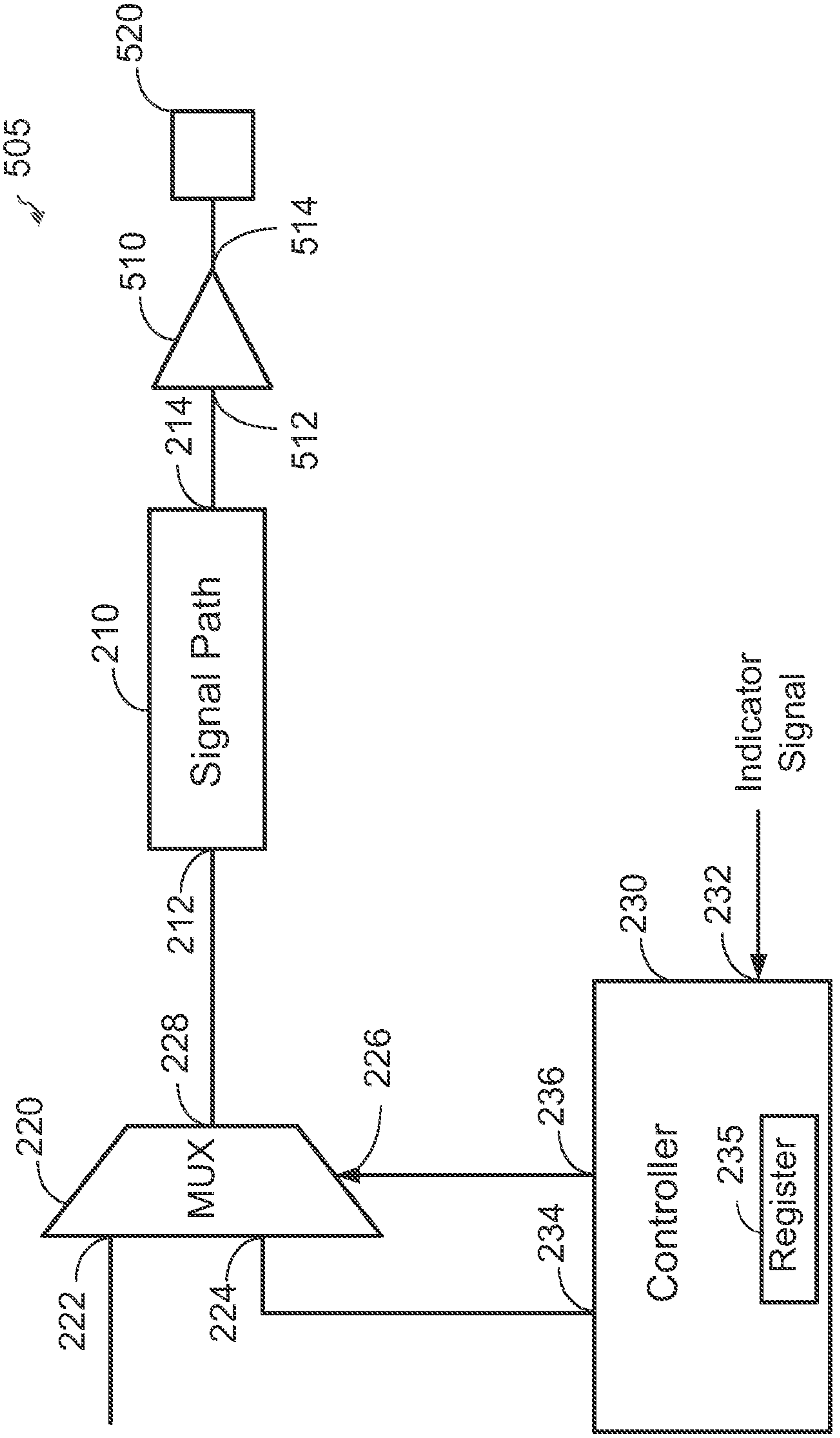
FIG. 5A shows another example of a system including a multiplexer with aging control according to certain aspects of the present disclosure.

FIG. 5A shows an example of a system 505 including the signal path 210, the multiplexer 220, and the controller 230 discussed above. The system 505 also includes a driver 510 and a pad 520. The driver 510 has an input 512 and an output 514. The input 512 of the driver 510 is coupled to the output 214 of the signal path 210, and the output 514 of the driver 510 is coupled to the pad 520. In certain aspects, the signal path 210, the multiplexer 220, the driver 510, and the pad 520 may be integrated on a chip (i.e., die) and the pad 520 may be coupled to another chip via a metal line (e.g., formed on a printed circuit board (PCB)).

The driver 510 may be configured to receive the signal from the signal path 210 in the active mode and drive the pad 520 (and hence the metal line) based on the received signal. For example, the driver 510 may be configured to drive the pad 520 high when the received signal is high and drive the pad 520 low when the received signal is low. Alternately, the driver 510 may be configured to drive the pad 520 low when the received signal is high and drive the pad 520 high when the received signal is low. The driver 510 may be implemented with a pull-up transistor for driving the pad 520 high and a pull-down transistor for driving the pad 520 low.

In one example, the metal line (not shown) may be coupled between the pad 520 and another chip (not shown). In this example, the driver 510 may be configured to transmit the signal to the other chip via the metal line by driving the pad 520 (and hence metal line) based on the signal. In this example, the signal path 210 and the driver 510 may be located in a transmit path of the system 505. As discussed above, the signal may be a data signal, a clock signal, a control signal, an address signal, or another type of signal.

In the example in FIG. 5A, the logic state at the output 214 of the signal path 210 may toggle between high and low over multiple idle periods. This is because the controller 230 may alternatively park the input 212 of the signal path 210 high and low to balance aging, as discussed above. In some use cases, it is desirable for the input 512 of the driver 510 and/or the pad 520 to be low (i.e., logic zero) in the idle mode. For example, a specification may require that the pad 520 be low in the idle mode so that a transmission line (not shown) coupled to the pad 520 is held low in the idle mode. In these cases, a clock gating circuit 540 (also referred to as a clock gating cell) may be coupled between the output 214 of the signal path 210 and the input 512 of the driver 510 to isolate the driver 510 and the pad 520 from the toggling between low and high at the output 214 of the signal path 210 in the idle mode, an example of which is shown in FIG. 5B.

Figure 5B:
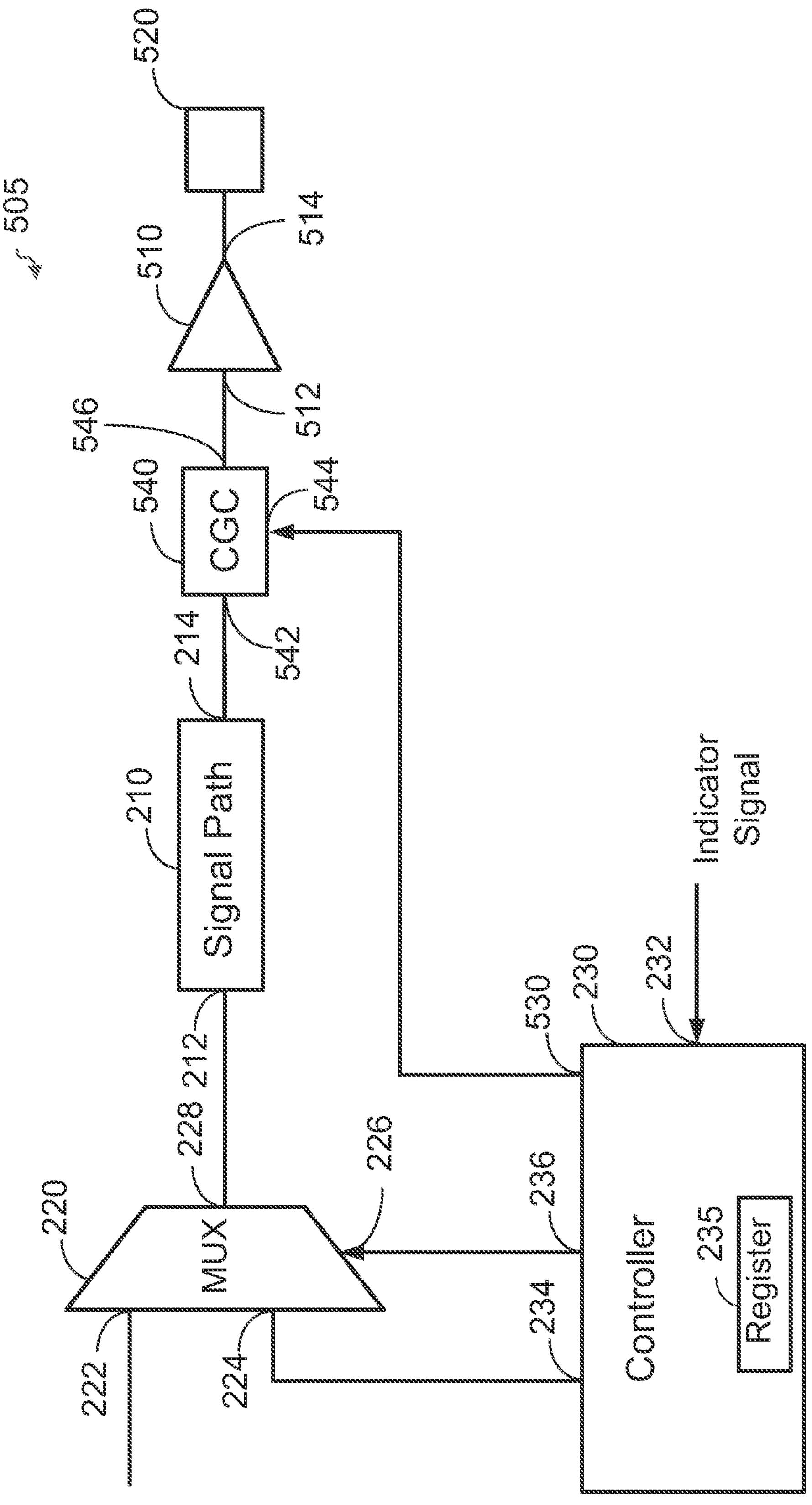
FIG. 5B shows an example of the system in FIG. 5A including a clock gating circuit according to certain aspects of the present disclosure.

In the example shown in FIG. 5B, the clock gating circuit 540 has a signal input 542 coupled to the output 214 of the signal path 210, an output 546 coupled to the input 512 of the driver 510, and a control input 544 coupled to a third output 530 of the controller 230. In this example, the controller 230 may be configured to selectively gate or un-gate the clock gating circuit 540 via the third output 530. For example, the clock gating circuit 540 may be configured to gate when a first logic value is input to the control input 544 and un-gate when a second logic value is input to the control input 544. In this example, the controller 230 may gate the clock gating circuit 540 by outputting the first logic value to the control input 544 of the clock gating circuit 540, and un-gate the clock gating circuit 540 by outputting the second logic value to the control input 544 of the clock gating circuit 540. In this example, the first logic value may be one and the second logic value may be zero, or vice versa. In this example, the clock gating circuit 540 may be configured to park the output 546 low when the clock gating circuit 540 is gated.

In this example, the controller 230 may be configured to un-gate the clock gating circuit 540 in the active mode and gate the clock gating circuit 540 in the idle mode (e.g., when the controller 230 receives the indicator signal indicating the idle mode at the input 232). In this example, the clock gating circuit 540 parks the output 546 low in the idle mode, which isolates the driver 510 and the pad 520 from the toggling between low and high at the output 214 of the signal path 210 in the idle mode.

It is to be appreciated that the present disclosure is not limited to the example shown in FIG. 5B. For example, in another example, the clock gating circuit 540 may be coupled between the output 514 of the driver 510 and the pad 520 to isolate the pad 520 from the toggling in the idle mode. In this example, the controller 230 may gate the clock gating circuit 540 in the idle mode and un-gate the clock gating circuit 540 in the active mode, as discussed above.

Figure 5C:
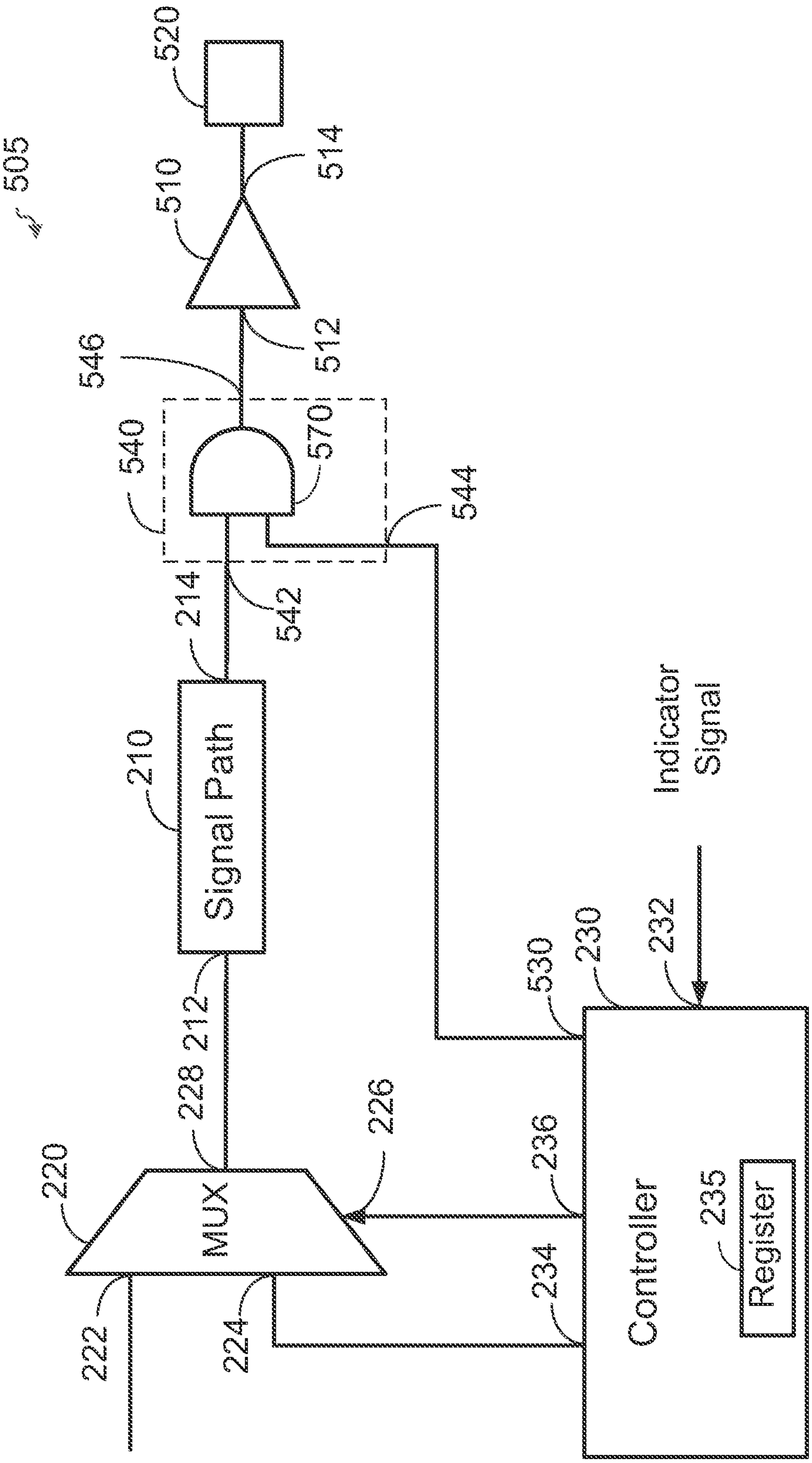
FIG. 5C shows an exemplary implementation of the clock gating circuit according to certain aspects of the present disclosure.

The clock gating circuit 540 may be implemented with one or more logic gates. For example, FIG. 5C shows an example in which the clock gating circuit 540 includes an AND gate 570. In this example, a first input of the AND gate 570 is coupled to the signal input 542, a second input of the AND gate 570 is coupled to the control input 544, and the output of the AND gate 570 is coupled to the output 546. In this example, the AND gate 570 un-gates the clock gating circuit 540 when the logic value at the control input 544 is one. The AND gate 570 gates the clock gating circuit 540 and parks the output 546 low when the logic value at the control input 544 is zero. In one example, the AND gate 570 may be implemented with a NAND gate and an inverter. It is to be appreciated that the clock gating circuit 540 is not limited to the example shown in FIG. 5C, and that the clock gating circuit 540 may be implemented with another type of logic gate and/or a combination of logic gates. It is also to be appreciated that the clock gating circuit 540 may include additional components (e.g., a latching circuit or synchronizer to prevent glitching) not shown in FIG. 5C.

In the above example, the clock gating circuit 540 is configured to park the output 546 low when the clock gating circuit 540 is gated. However, it is to be appreciated that the present disclosure is not limited to this example. For example, in some use cases, it may be desirable for the input 512 of the driver 510 and/or the pad 520 to be high (i.e., logic one) in the idle mode. In these cases, the clock gating circuit 540 is configured to park the output 546 high when the clock gating circuit 540 is gated. In these cases, the clock gating circuit 540 may be implemented with an OR gate or a combination of logic gates.

Figure 6:
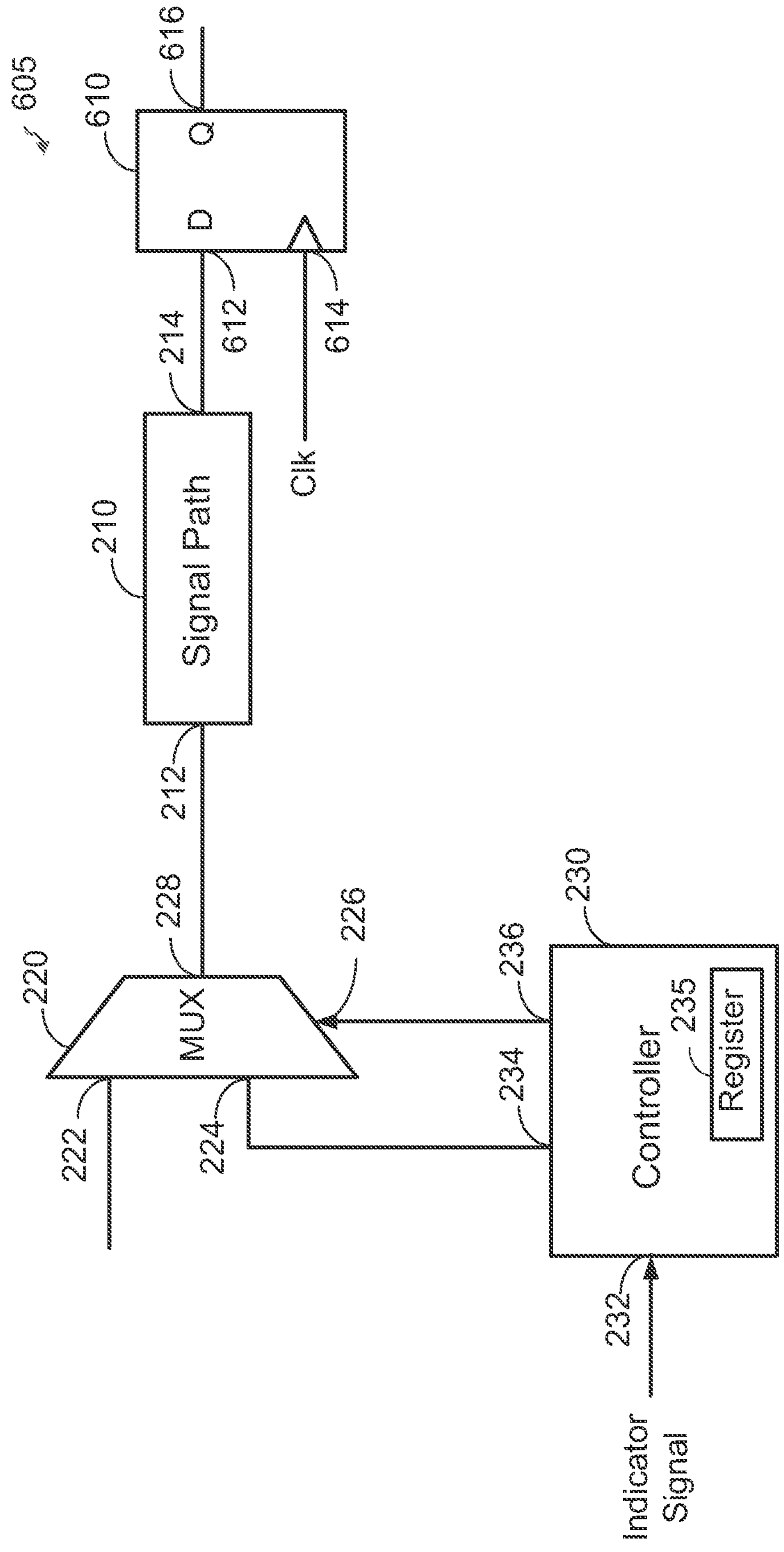
FIG. 6 shows another example of a system including a multiplexer with aging control according to certain aspects of the present disclosure.

FIG. 6 shows an example of a system 605 including the signal path 210, the multiplexer 220, and the controller 230 discussed above. The system 605 also includes a latching circuit 610 (e.g., flip-flop) having a signal input 612, a clock input 614, and an output 616. The signal input 612 is coupled to the output 214 of the signal path 210. In this example, the signal in the active mode may be a data signal, a control signal, or an address signal.

In the active mode, the latching circuit 610 is configured to receive the signal from the signal path 210 at the signal input 612 and receive a clock signal (labeled "Clk") at the clock input 614. The latching circuit 610 is configured to latch (i.e., capture) a logic value of the signal on an edge of the clock signal and output the latched logic value at the output 616. The output 616 may be coupled to a circuit configured to receive the latched logic value. The circuit may include another latching circuit, a processor, a data buffer, etc. The edge of the clock signal used to latch the logic value may be a rising edge or a falling edge.

Figure 7:
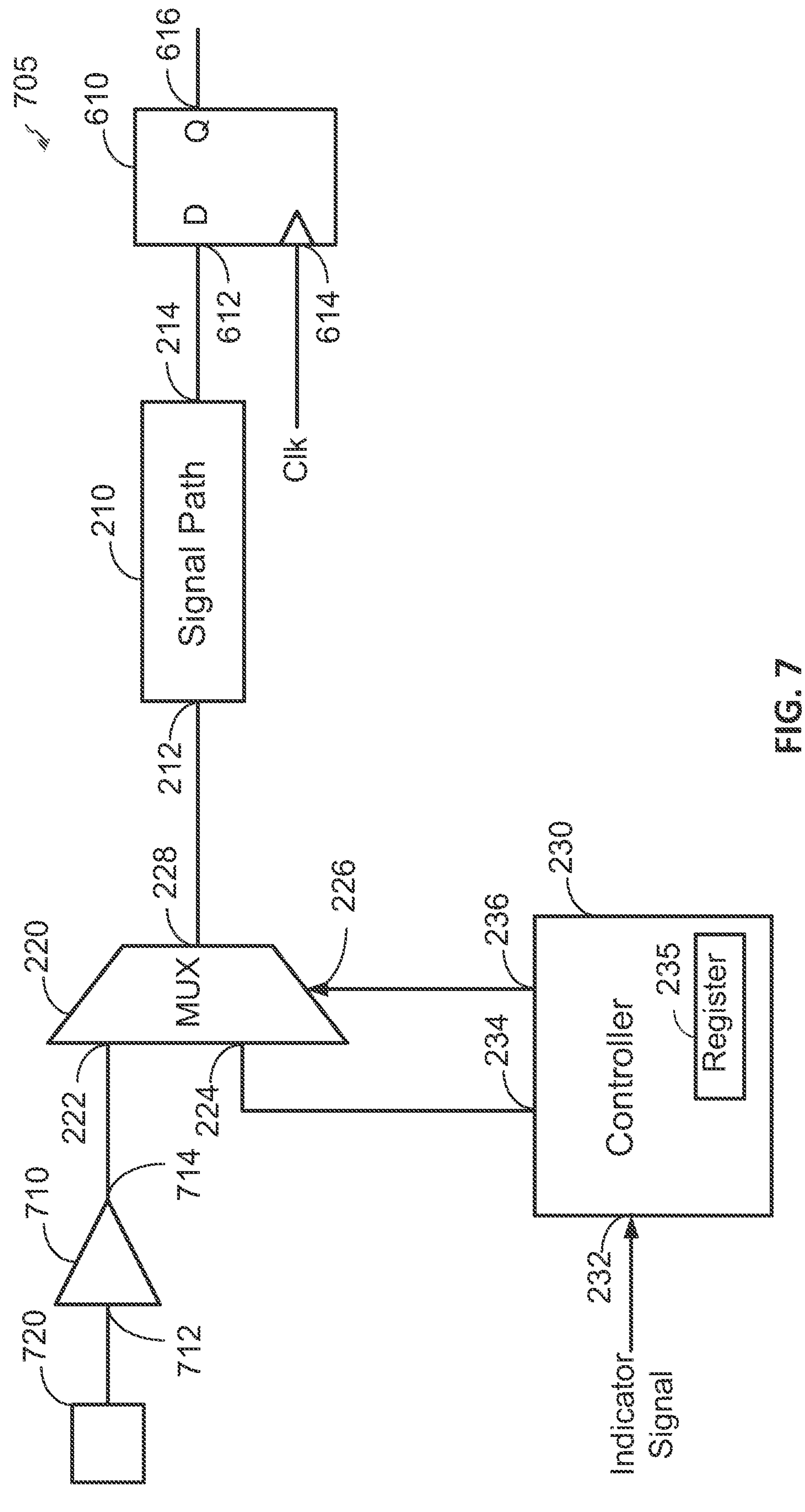
FIG. 7 shows another example of a system including a multiplexer with aging control according to certain aspects of the present disclosure.

FIG. 7 shows an example of a system 705 including the signal path 210, the multiplexer 220, the controller 230, and the latching circuit 610 discussed above. The system 705 also includes a pad 720, and a receiver 710. The receiver 710 has an input 712 and an output 714. The input 712 of the receiver 710 is coupled to the pad 720 and the output 714 of the receiver 710 is coupled to the first input 222 of the multiplexer 220. In certain aspects, the pad 720, the receiver 710, the multiplexer 220, the signal path 210, and the latching circuit 610 may be integrated on a chip (i.e., die) and the pad 720 may be coupled to another chip via a metal line (e.g., formed on a printed circuit board (PCB)).

The receiver 710 may be configured to receive the signal from the other chip (not shown) via the pad 720. The receiver 710 may amplify the received signal and/or perform equalization on the received signal (e.g., to compensate for signal attenuation in the metal line). The receiver 710 outputs the received signal to the first input 222 of the multiplexer 220. In this example, the receiver 710 and the signal path 210 may be located in a receive path of the system 705. In this example, the signal may be a data signal (e.g., transmitted by the other chip to the pad 720 via the metal line).

Figure 8:
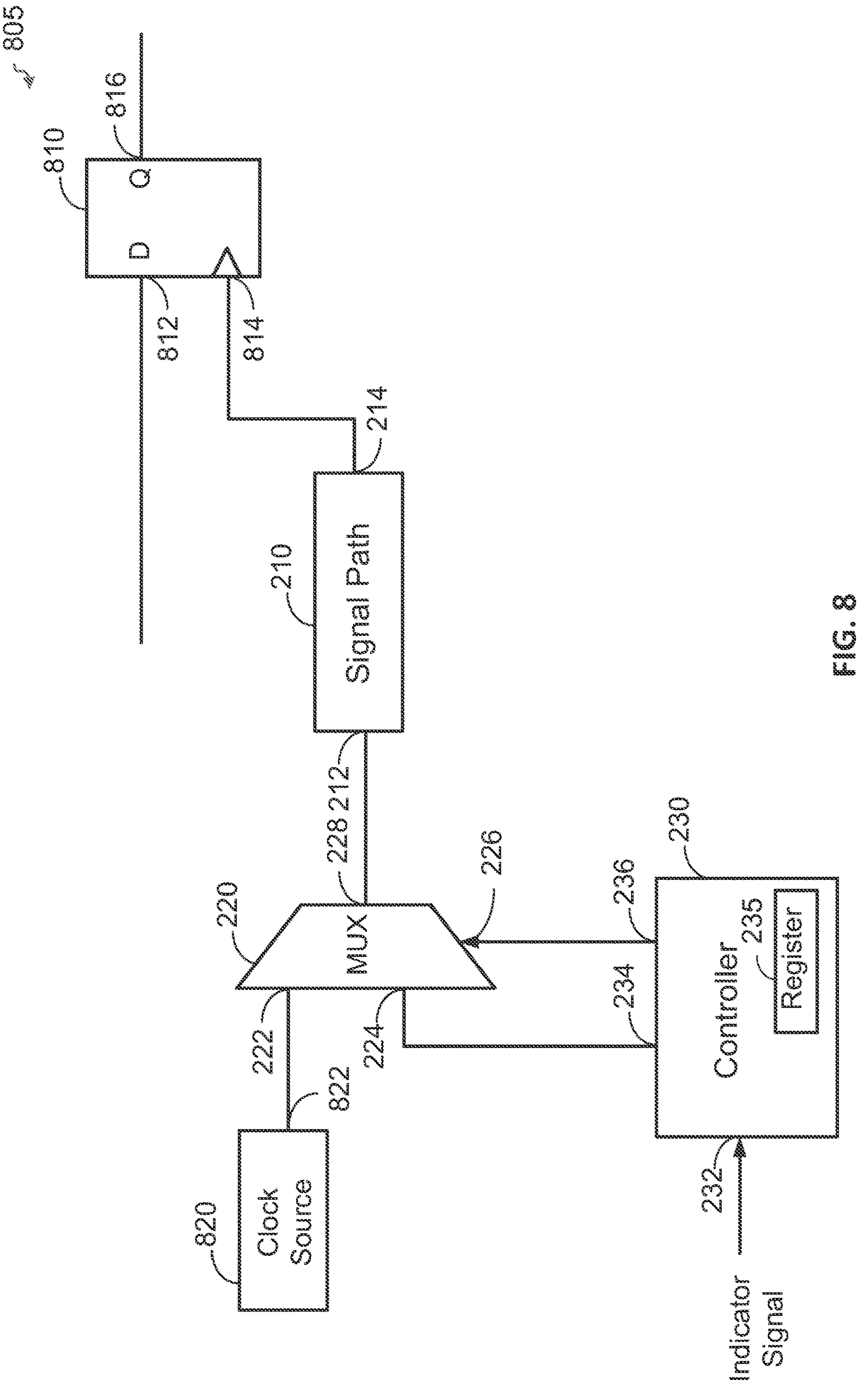
FIG. 8 shows another example of a system including a multiplexer with aging control according to certain aspects of the present disclosure.

FIG. 8 shows an example of a system 805 including the signal path 210, the multiplexer 220, and the controller 230 discussed above. The system 805 also includes a latching circuit 810 (e.g., flip-flop) having a signal input 812, a clock input 814, and an output 816. The clock input 814 is coupled to the output 214 of the signal path 210. In this example, the signal in the active mode is a clock signal.

In the active mode, the latching circuit 810 is configured to receive a data signal at the signal input 812 and receive the clock signal from the signal path 210 at the clock input 814. The latching circuit 810 is configured to latch (i.e., capture) a logic value of the data signal on an edge of the clock signal and output the latched logic value at the output 816.

The output 816 may be coupled to a circuit configured to receive the latched logic value. The circuit may include another latching circuit, a processor, a data buffer, etc. The edge of the clock signal used to latch the logic value may be a rising edge or a falling edge. In this example, the signal path 210 may be configured to delay the clock signal to adjust the timing of the clock signal (e.g., center the edge of the clock signal between transitions of the data signal).

In the example shown in FIG. 8, the system 805 also includes a clock source 820 configured to output the clock signal at output 822, which is coupled to the first input 222 of the multiplexer 220. The clock source 820 may include a phase locked loop (PLL) or another type of clock generator. The clock source 820 may be integrated on the same chip as the multiplexer 220 or may be located on a separate chip.

Although the signal input to the signal input 812 of the latching circuit 810 is a data signal in the example discussed above, it is to be appreciated that the signal may also be a control signal or an address signal. For example, the latching circuit 810 may be used for latching command bits or address bits.

Figure 9A:
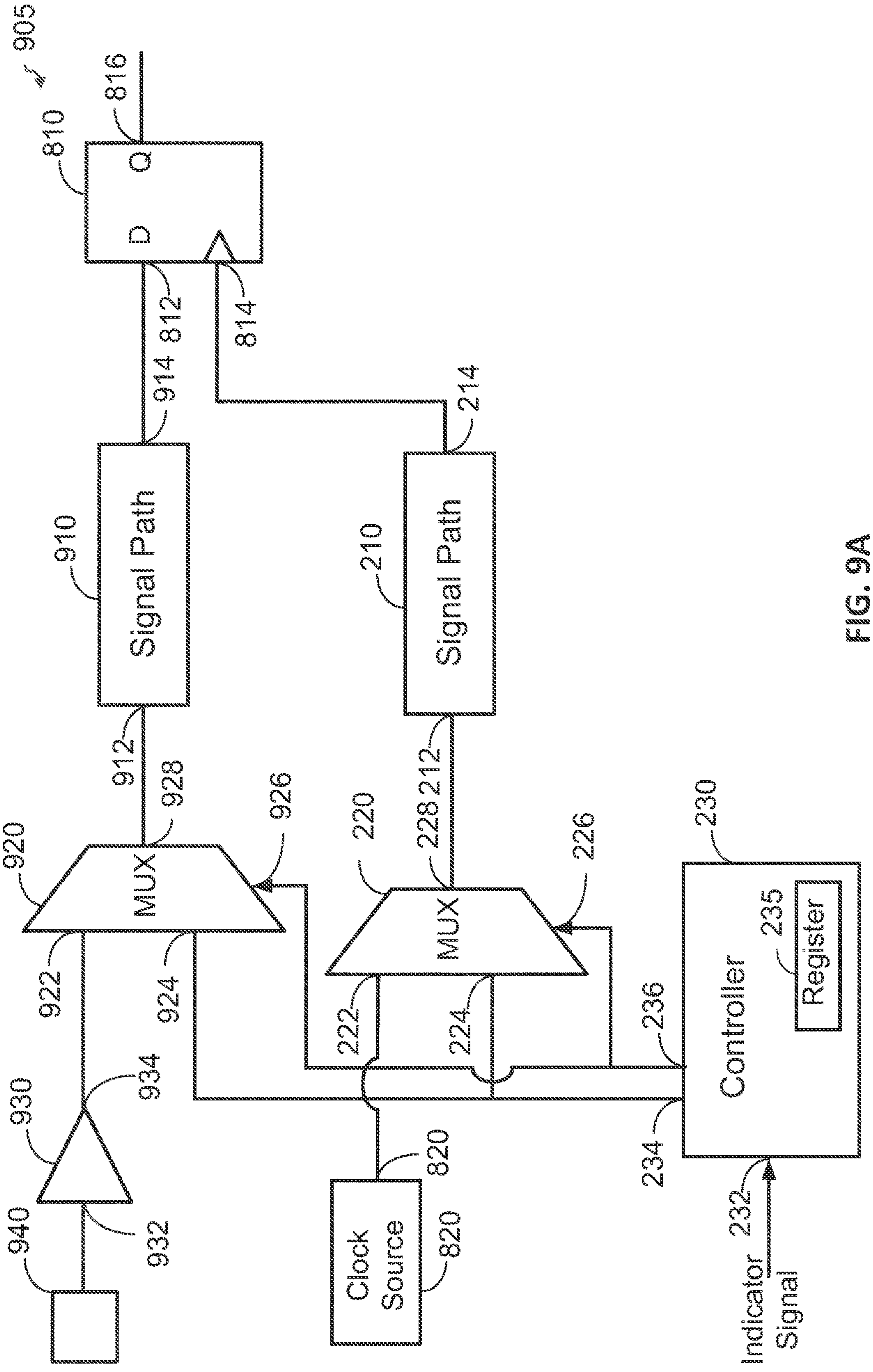
FIG. 9A shows an example of a system with aging control for two signal paths according to certain aspects of the present disclosure.

FIG. 9A shows an example of a system 905 including the signal path 210, the multiplexer 220, the controller 230, and the latching circuit 810 discussed above. The system 905 also includes a second multiplexer 920, a second signal path 910, a pad 940, and a receiver 930. In the discussion of FIG. 9A below, the signal path 210 is referred to as the first signal path and the multiplexer 220 is referred to as the first multiplexer.

The second signal path 910 has an input 912 and an output 914, in which the output 914 is coupled to the signal input 812 of the latching circuit 810. The second signal path 910 may be configured to delay the data signal, the control signal, or the address signal discussed above with reference to FIG. 8.

The second multiplexer 920 has a first input 922, a second input 924, a select input 926, and an output 928. The output 928 of the second multiplexer 920 is coupled to the input 912 of the second signal path 910. The second multiplexer 920 is configured to selectively couple the first input 922 or the second input 924 to the output 928 based on a select signal received at the select input 926. For example, the second multiplexer 920 may couple the first input 922 to the output 928 (i.e., select the first input 922) when the select signal has the first logic value, and couple the second input 924 to the output 928 (i.e., select the second input 924) when the select signal has the second logic value. In the example shown in FIG. 9A, the second input 924 is coupled to the first output 234 of the controller 230, and therefore receives the aging control signal output from the controller 230. The select input 926 is coupled to the second output 236 of the controller 230, and therefore receives the select signal output from the controller 230. Thus, in this example, the controller 230 controls the aging of the first signal path 210 and the aging of the second signal path 910. In this example, the idle periods of the first signal path 210 and the second signal path 910 may be the same. However, it is to be appreciated that this need not be the case, as discussed further below with reference to FIG. 9B.

The receiver 930 has an input 932 and an output 934. The input 932 of the receiver 930 is coupled to the pad 940 and the output 934 of the receiver 930 is coupled to the first input 922 of the second multiplexer 920. In certain aspects, the pad 940, the receiver 930, the first multiplexer 220, the second multiplexer 920, the first signal path 210, the second signal path 910, and the latching circuit 810 may be integrated on a chip (i.e., die) and the pad 940 may be coupled to another chip via a metal line (e.g., formed on a printed circuit board (PCB)).

The receiver 930 be configured to receive the signal (e.g., data signal, the control signal, or the address signal) from the other chip (not shown) via the pad 940. The receiver 930 may amplify the received signal and/or perform equalization on the received signal (e.g., to compensate for signal attenuation in the metal line). The receiver 930 outputs the received signal to the first input 922 of the second multiplexer 920. In this example, the receiver 930 and the signal path 910 may be located in a receive path of the system 905.

As discussed above, in this example, the controller 230 controls aging of the first signal path 210 and the aging of the second signal path 910. In the active mode, the controller 230 instructs the first multiplexer 220 to select the respective first input 222 and the second multiplexer 920 to select the respective first input 922. In the idle mode, the controller 230 instructs the first multiplexer 220 to select the respective second input 224 and the second multiplexer 920 to select the respective second input 924. The controller 230 then controls aging of the first signal path 210 and the second signal path 910 using the aging control signal (e.g., using any of the techniques discussed above with reference to FIG. 2). For example, the controller 230 may alternately park the input 212 of the first signal path 210 low and high over multiple idle periods and alternately park the input 912 of the second signal path 910 low and high over multiple idle periods. In another example, the controller 230 may control the aging of the first signal path 210 and the second signal path 910 based on an aging pattern (e.g., sequence of N bits), as discussed above.

Figure 9B:
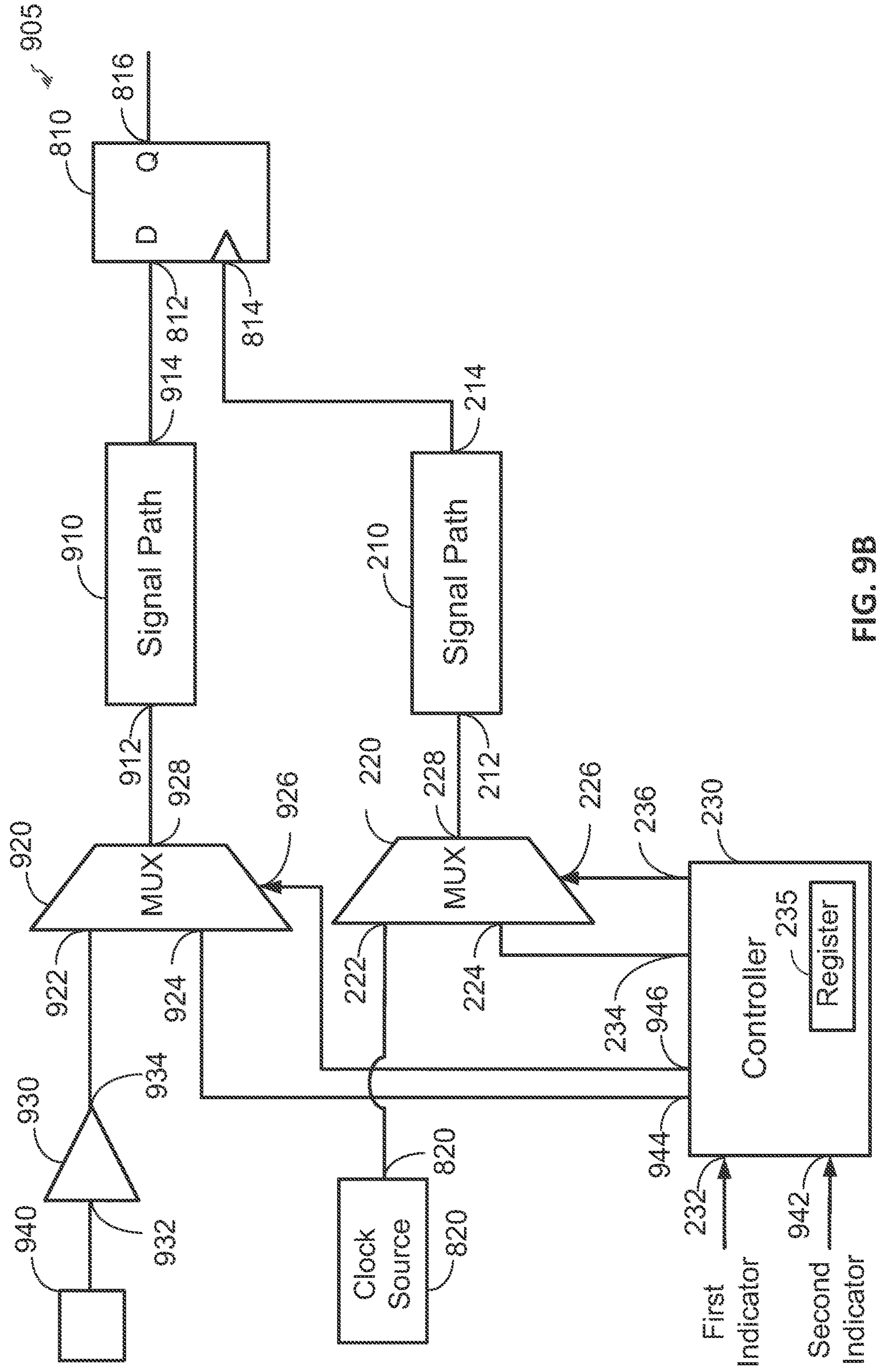
FIG. 9B shows another example of a system with aging control for two signal paths according to certain aspects of the present disclosure.

FIG. 9B shows an example in which the controller 230 may independently control aging of the first signal path 210 and the aging of the second signal path 910 according to certain aspects. In this example, the controller 230 has a second input 952, a third output 944, and a fourth output 946, which are used to control the aging of the second signal path 910. In the discussion of FIG. 9B below, the input 232 is referred to as the first input.

In this example, the third output 944 is coupled to the second input 924 of the second multiplexer 920 and the fourth output 946 is coupled to the select input 926 of the second multiplexer 920. The first input 232 is configured to receive a first indicator signal indicating the idle periods of the first signal path 210, and the second input 942 is configured to receive a second indicator signal indicating the idle periods of the second signal path 910. The idle periods of the first signal path 210 and idle period of the second signal path 910 may overlap in time. In this example, the controller 230 is configured to output a first aging control signal at the first output 234 to control aging of the first signal path 210 and output a second aging control signal at the third output 944 to control aging of the second signal path 910.

Exemplary operations of the controller 230 will now be discussed according to certain aspects. In the active mode of the first signal path 210, the controller 230 instructs the first multiplexer 220 to select the first input 222 via the second output 236. As a result, the first multiplexer 220 passes the clock signal received at the first input 222 to the first signal path 210.

In the idle mode of the first signal path 210, the controller 230 instructs the first multiplexer 220 to select the second input 224. As a result, the multiplexer 220 couples the first aging control signal output from the first output 234 of the controller 230 to the second input 224 of the multiplexer 220. This allows the controller 230 to control the aging of the first signal path 210 in the idle mode using the first aging control signal, as discussed above with reference to FIG. 2. In this example, the controller 230 determines that the first signal path 210 is idle when the first indicator signal is received at the first input 232 indicating that the first signal path 210 is in the idle mode.

In the active mode of the second signal path 910, the controller 230 instructs the second multiplexer 920 to select the first input 922 via the fourth output 946. As a result, the second multiplexer 920 passes the signal (e.g., data signal, control signal, or address signal) received at the first input 922 to the second signal path 910.

In the idle mode of the second signal path 910, the controller 230 instructs the second multiplexer 920 to select the second input 924. As a result, the second multiplexer 920 couples the second aging control signal output from the third output 944 of the controller 230 to the second input 924 of the second signal path 910. This allows the controller 230 to control the aging of the second signal path 910 in the idle mode of the second signal path using the second aging control signal (e.g., using any one of the techniques discussed above with reference to FIG. 2). For example, the controller 230 may alternately park the input 912 of the second signal path 910 low and high over multiple idle periods of the second signal path 910. In another example, the controller 230 may control the aging of the second signal path 910 based on an aging pattern (e.g., sequence of N bits), as discussed above. In this example, the controller 230 determines that the second signal path 910 is idle when the second indicator signal is received at the second input 942 indicating that the second signal path 910 is in the idle mode. For example, the second signal path 910 may be in the idle mode when the receiver 930 is not receiving incoming data traffic for the example of a data signal.

Figure 10:
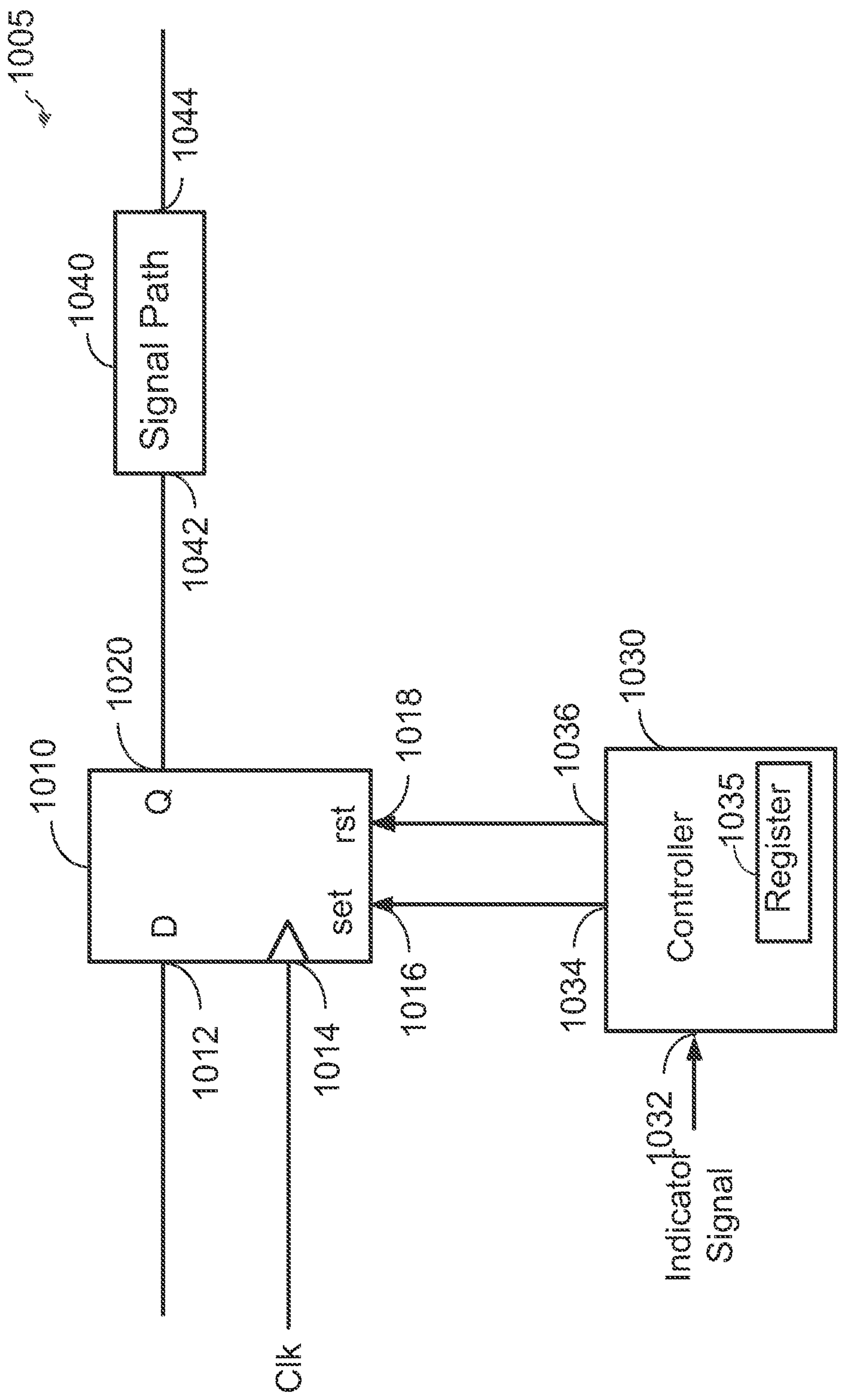
FIG. 10 shows an example of a system including a latching circuit with aging control according to certain aspects of the present disclosure.

FIG. 10 shows a system 1005 with aging mitigation according to certain aspects of the present disclosure. In this example, the system includes a signal path 1040, a latching circuit 1010 (e.g., flip-flop), and a controller 1030.

The signal path 1040 has an input 1042 and an output 1044. The input 1042 may be configured to receive a signal in the active mode. The signal may be a data signal, a control signal, an address signal, or another type of signal. The signal path 1040 may include a delay circuit (e.g., delay circuit 115) for delaying the signal. For example, the delay circuit may be configured to delay the signal to adjust the timing of the signal relative to another signal, as discussed further below. It is to be appreciated that the signal path 1040 may include one or more other circuits instead of or in addition to the delay circuit. The one or more other circuits may include one or more logic gates, a sequential logic circuit, etc. The output 1044 of the signal path 1040 may be coupled to a sequential logic circuit, a driver, a pad, or another circuit, as discussed further below.

The latching circuit 1010 has a signal input 1012, a clock input 1014, a set input 1016, a reset input 1018, and an output 1020. The output 1020 of the latching circuit 1010 is coupled to the input 1042 of the signal path 1040. The signal input 1012 is configured to receive a signal (e.g., a data signal, a control signal, or an address signal), and the clock input 1014 is configured to receive a clock signal (labeled "Clk"). The latching circuit 1010 is configured to latch (i.e., capture) a logic value of the signal on an edge of the clock signal and output the latched logic value at the output 1020. For the example where the signal in the active mode is a data signal, the signal input 1012 may be referred to as a data input.

The latching circuit 1010 is configured to set when the set input 1016 is asserted (e.g., a logic one is input to the set input 1016). When the set input 1016 is asserted, the output 1020 of the latching circuit 1010 is high (i.e., logic one). The latching circuit 1010 is configured to reset when the reset input 1018 is asserted (e.g., a logic one is input to the reset input 1018). When the reset input 1018 is asserted, the output 1020 of the latching circuit 1010 is low (i.e., logic zero).

The controller 1030 has an input 1032, a first output 1034, and a second output 1036. The input 1032 may be configured to receive an indicator signal that indicates to the controller 1030 when the signal path 1040 is in idle mode. For the example where the signal input to the signal path 1040 is a data signal, the signal path 1040 may enter the idle mode when there is no incoming data traffic to the signal path 1040. In this example, the indicator signal may be generated by a circuit (not shown) that controls (e.g., manages) data traffic in the system 1005. The first output 1034 of the controller 1030 is coupled to the set input 1016 of the latching circuit 1010 and the second output 1036 of the controller is coupled to the reset input 1018 of the latching circuit 1010. As discussed further below, the controller 1030 uses the set input 1016 and the reset input 1018 of the latching circuit 1010 to control whether the input 1042 of the signal path 1040 (which is coupled to the output 1020 of the latching circuit 1010) is parked high or low in the idle mode.

In the active mode (also referred to as functional mode), the controller 1030 de-asserts the set input 1016 and the reset input 1018 of the latching circuit 1010 (e.g., inputs a logic zero to both the set input 1016 and the reset input 1018). In this case, the latching circuit 1010 latches logic values of the signal (e.g., data signal, control signal, or address signal) on edges of the clock signal and outputs the latched logic values to the signal path 1040.

In the idle mode, the controller 1030 controls aging of the signal path 1040 using the set input 1016 and reset input 1018 of the latching circuit 1010. The controller 1030 may determine that the signal path 1040 is in the idle mode when the input 1032 of the controller 1030 receives the indicator signal indicating the idle mode. In this example, the controller 1030 may park the input 1042 of the signal path 1040 high by asserting the set input 1016 (e.g., inputting a logic one to the set input 1016). The controller 1030 may park the input 1042 of the signal path 1040 low by asserting the reset input 1018 (e.g., inputting a logic one to the reset input 1018). Note that one of the set input 1016 and the reset input 1018 is asserted at a time in this example.

In the idle mode, the controller 1030 may control aging of the signal path 1040 using any of the techniques discussed above with reference to FIG. 2. For example, the controller 1030 may alternately park the input 1042 of the signal path 1040 low and high over multiple idle periods by alternately asserting the set input 1016 and the reset input 1018 of the latching circuit 1010 over the multiple idle periods. For example, the controller 1030 may park the input 1042 low during odd idle periods and park the input 1042 high during even idle periods, or vice versa. In this example, the controller 1030 may assert the reset input 1018 during the odd idle periods and assert the set input 1016 during the even idle periods, or assert the set input 1016 during the odd idle periods and assert the reset input 1018 during the even idle periods.

In another example, the controller 1030 may control the aging of the signal path 1040 based on an aging pattern, as discussed above. For example, the aging pattern may be repeated for each N consecutive idle periods, where N is an integer. For each N consecutive idle periods, the aging pattern may indicate a number k of the N consecutive idle periods in which the input 1042 of the signal path 1040 is parked high and a number (i.e., N-k) of the N consecutive idle periods in which the input 1042 of the signal path 1040 is parked low. For example, if N equals 8, then the aging pattern is repeated for each 8 consecutive idle periods. In this aspect, the controller 1030 may control aging based on the aging pattern by asserting the set input 1016 for k of the N consecutive idle periods and asserting the reset input 1018 for N-k of the N consecutive idle periods. N may be an integer greater than one, k may be an integer equal to or greater than one, and N may be greater than k. In one example, k and N may be stored as parameters in a register 1035 in the controller 1030. In this example, k and N may be programmable by writing the values for k and N in the register 1035. It is to be appreciated that the register 1035 may be omitted in some implementations.

In certain aspects, the aging pattern is specified by a sequence of N bits. In these aspects, each bit in the sequence corresponds to one of the N consecutive idle periods and each bit indicates whether the input 1042 of the signal path 1040 is parked high or low during the corresponding one of the N consecutive idle periods. For example, a bit value of one may indicate that that the input 1042 of the signal path 1040 is parked high during the corresponding idle period and a bit value of zero may indicate that the input 1042 of the signal path 1040 is parked low during the corresponding idle periods, or vice versa. For example, an aging pattern given by the bit sequence 11100000 may indicate that the input 1042 is parked high for three of 8 consecutive idle periods and parked low for five of the 8 consecutive idle periods.

In certain aspects, the controller 1030 may control aging based on the sequence of N bits by controlling the set input 1016 and reset input 1018 based on the sequence of N bits, where each bit in the sequence corresponds to a respective one of N consecutive idle periods. For each of the N idle periods, the controller 230 may assert the set input 1016 to park the input 1042 high if the corresponding bit in the sequence has a first logic value and assert the reset input 1018 to park the input 1042 low if the corresponding bit in the sequence has a second logic value. The first logic value may be one and the second logic value may be zero, or vice versa.

Figure 11A:
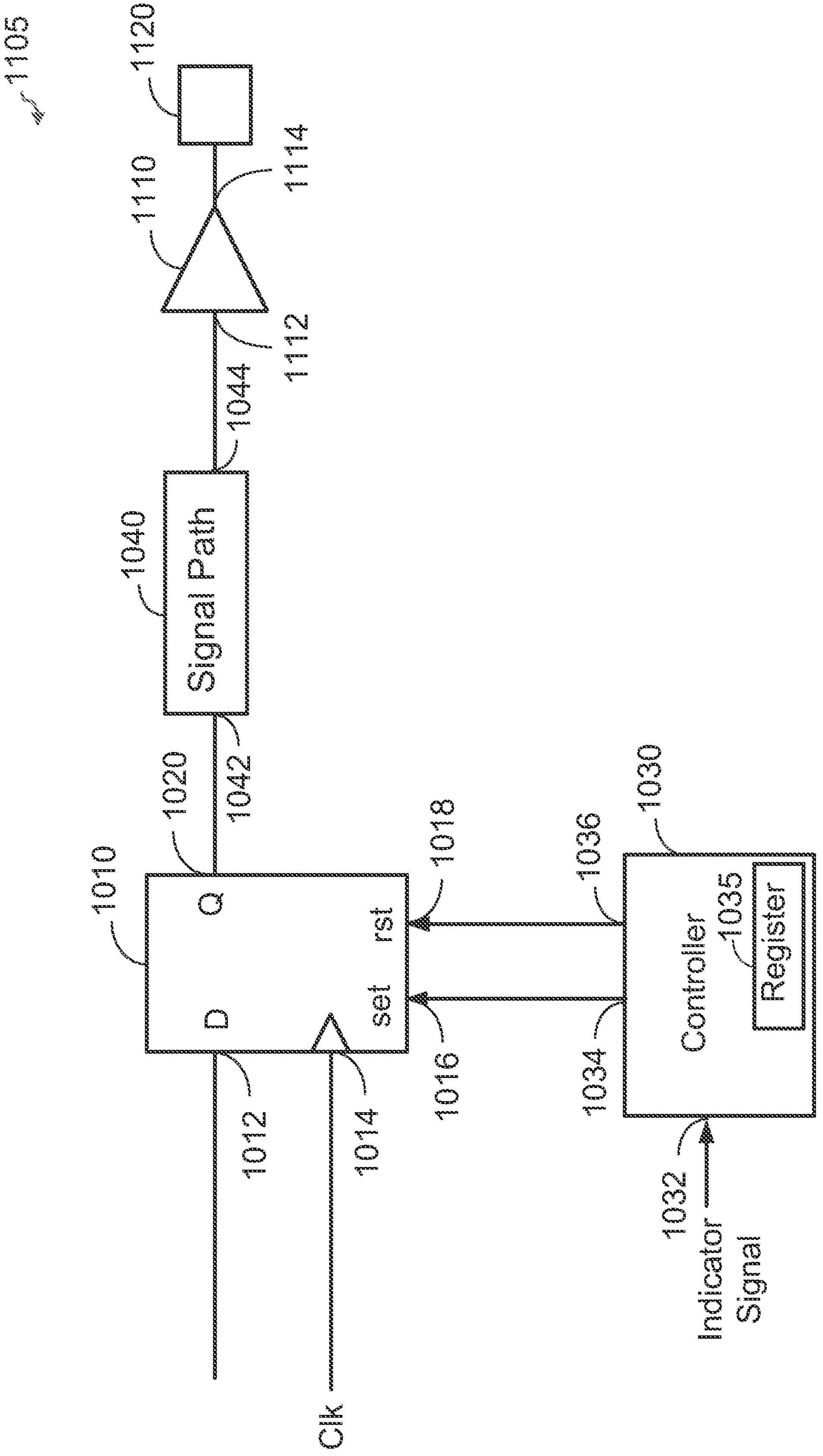
FIG. 11A shows another example of a system including a latching circuit with aging control according to certain aspects of the present disclosure.

FIG. 11A shows an example of a system 1105 including the signal path 1040, the latching circuit 1010, and the controller 1030 discussed above. The system 1105 also includes a driver 1110 and a pad 1120. The driver 1110 has an input 1112 and an output 1114. The input 1112 of the driver 1110 is coupled to the output 1044 of the signal path 1040, and the output 1114 of the driver 1110 is coupled to the pad 1120. In certain aspects, the signal path 1040, the latching circuit 1010, the driver 1110, and the pad 1120 may be integrated on a chip (i.e., die) and the pad 1120 may be coupled to another chip via a metal line (e.g., formed on a printed circuit board (PCB)).

The driver 1110 may be configured to receive the signal from the signal path 1040 in the active mode and drive the pad 1120 (and hence the metal line) based on the received signal. For example, the driver 1110 may be configured to drive the pad 1120 high when the received signal is high and drive the pad 1120 low when the received signal is low. Alternately, the driver 1110 may be configured to drive the pad 1120 low when the received signal is high and drive the pad 1120 high when the received signal is low. The driver 1110 may be implemented with a pull-up transistor for driving the pad 1120 high and a pull-down transistor for driving the pad 1120 low.

In the example in FIG. 11A, the logic state at the output 1044 of the signal path 1040 may toggle between high and low over multiple idle periods. This is because the controller 1030 may alternatively park the input 1042 of the signal path 1040 high and low to balance aging, as discussed above. In some use cases, it is desirable for the input 1112 of the driver 1110 and/or the pad 1120 to be low (i.e., logic zero) in the idle mode. For example, a specification may require that the pad 1120 be low in the idle mode so that a transmission line (not shown) coupled to the pad 1120 is held low in the idle mode. In these cases, a clock gating circuit 1140 (also referred to as a clock gating cell) may be coupled between the output 1044 of the signal path 1040 and the input 1112 of the driver 1110 to isolate the driver 1110 and the pad 1120 from the toggling between low and high at the output 1044 of the signal path 1040 in the idle mode, an example of which is shown in FIG. 11B.

Figure 11B:
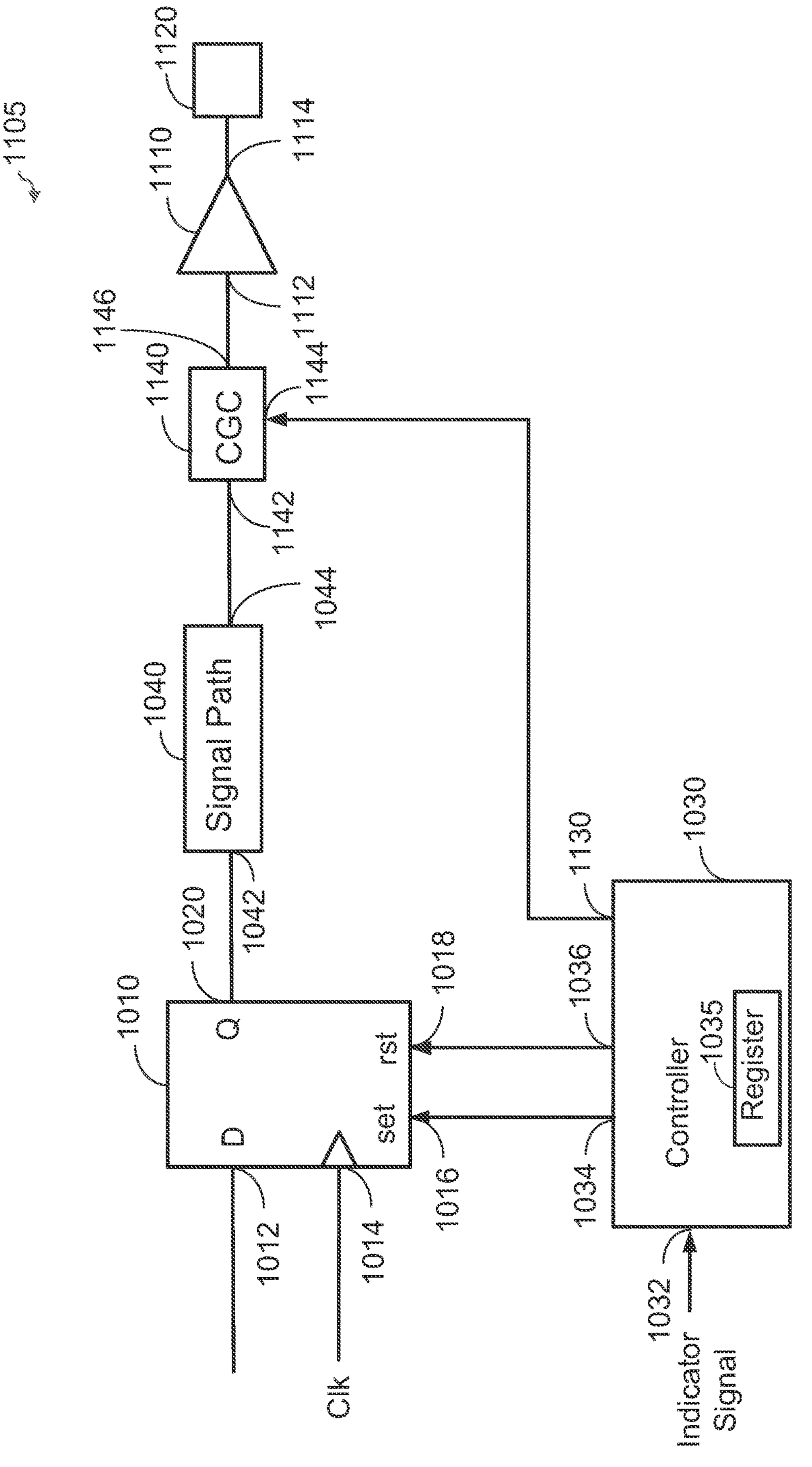
FIG. 11B shows an example of the system in FIG. 11A including a clock gating circuit according to certain aspects of the present disclosure.

In the example shown in FIG. 11B, the clock gating circuit 1140 has a signal input 1142 coupled to the output 1044 of the signal path 1040, an output 1146 coupled to the input 1112 of the driver 1110, and a control input 1144 coupled to a third output 1130 of the controller 1030. In this example, the controller 1030 may be configured to selectively gate or un-gate the clock gating circuit 1140 via the third output 1130. For example, the clock gating circuit 1140 may be configured to gate when a first logic value is input to the control input 1144 and un-gate when a second logic value is input to the control input 1144. In this example, the controller 1030 may gate the clock gating circuit 1140 by outputting the first logic value to the control input 1144 of the clock gating circuit 1140, and un-gate the clock gating circuit 1140 by outputting the second logic value to the control input 1144 of the clock gating circuit 1140. In this example, the first logic value may be one and the second logic value may be zero, or vice versa. In this example, the clock gating circuit 1140 may be configured to park the output 1146 low when the clock gating circuit 1140 is gated.

In this example, the controller 1030 may be configured to un-gate the clock gating circuit 1140 in the active mode and gate the clock gating circuit 1140 in the idle mode (e.g., when the controller 1030 receives the indicator signal indicating the idle mode at the input 1032). In this example, the clock gating circuit 1140 parks the output 1146 low in the idle mode, which isolates the driver 1110 and the pad 1120 from the toggling between low and high at the output 1044 of the signal path 1040 in the idle mode.

It is to be appreciated that the present disclosure is not limited to the example shown in FIG. 11B. For example, in another example, the clock gating circuit 1140 may be coupled between the output 1114 of the driver 1110 and the pad 1120 to isolate the pad 1120 from the toggling in the idle mode. In this example, the controller 1030 may gate the clock gating circuit 1140 in the idle mode and un-gate the clock gating circuit 1140 in the active mode, as discussed above.

In the above example, the clock gating circuit 1140 is configured to park the output 1146 low when the clock gating circuit 1140 is gated. However, it is to be appreciated that the present disclosure is not limited to this example. For example, in some use cases, it may be desirable for the input 1112 of the driver 1110 and/or the pad 1120 to be high (i.e., logic one) in the idle mode. In these cases, the clock gating circuit 1140 is configured to park the output 1146 high when the clock gating circuit 1140 is gated.

Figure 12:
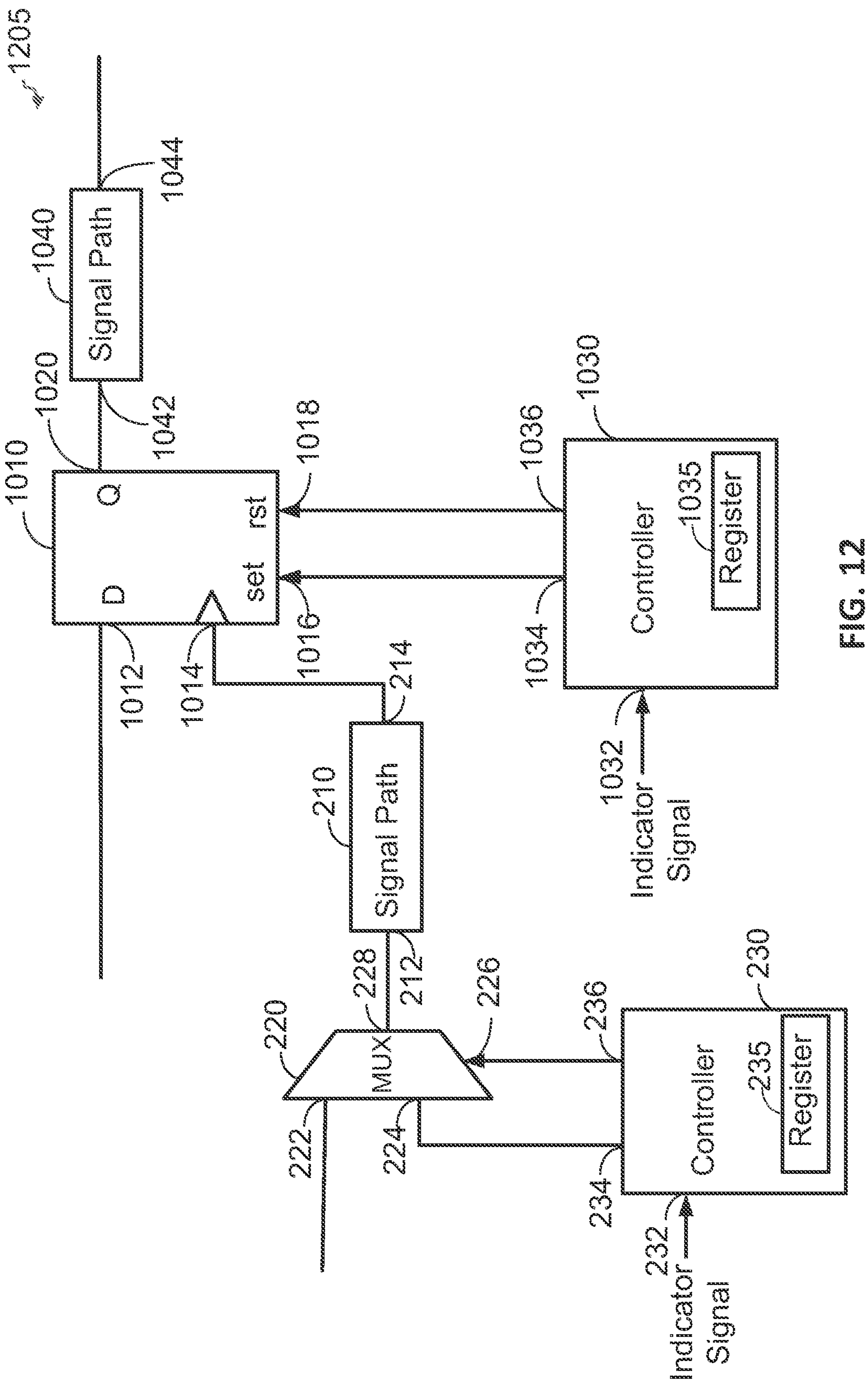
FIG. 12 shows an example of a system including a latching circuit and a multiplexer with aging control according to certain aspects of the present disclosure.

FIG. 12 shows an example of a system 1205 in which the exemplary system 205 shown in FIG. 2 is combined with the exemplary system 1005 shown in FIG. 10 according to certain aspects. In the discussion of FIG. 12 below, the signal path 210 is referred to as the first signal path, the signal path 1040 is referred to as the second signal path, the controller 230 is referred to as the first controller, and the controller 1030 is referred to as the second controller.

In this example, the output 214 of the first signal path 210 is coupled to the clock input 1014 of the latching circuit 1010. Thus, in this example, the clock signal used to clock the latching circuit 1010 propagates through the first signal path 210. The first controller 230 controls aging of the first signal path 210 in the idle mode of the first signal path 210, as discussed above with reference to FIG. 2. The second controller 1030 controls aging of the second signal path 1040 in the idle mode of the second signal path 1040, as discussed above with reference to FIG. 10. The output 1044 of the second signal path 1040 may be coupled to a driver (e.g., the driver 1110), a sequential logic circuit (e.g., flip-flop), a processor, or another type of circuit.

Figure 13:
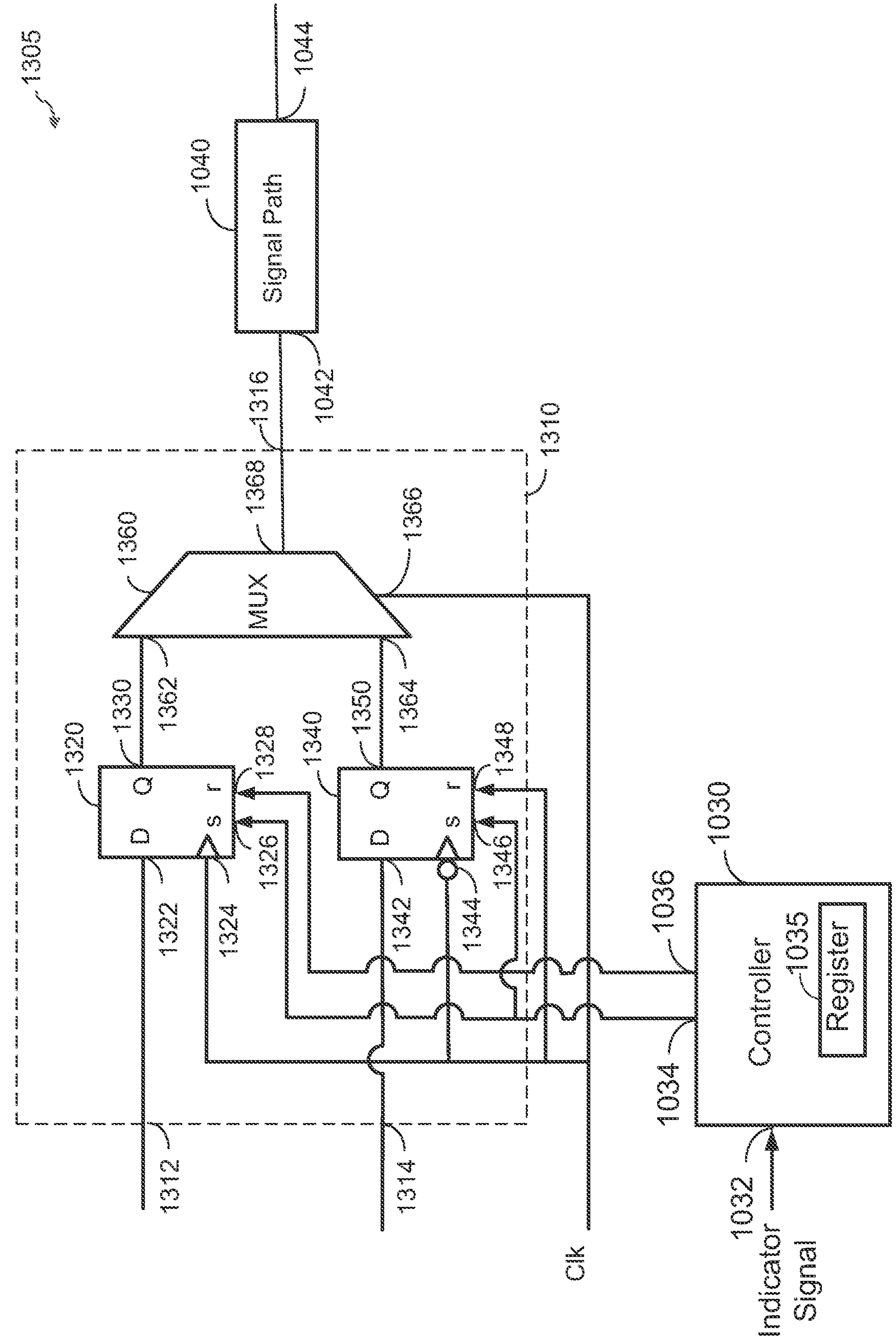
FIG. 13 shows an example of a system including a single data rate (SDR) to double data rate (DDR) converter with aging control according to certain aspects of the present disclosure.

FIG. 13 shows an example of a system 1305 including the signal path 1040 and the controller 1030 discussed above. The system 1305 also includes a single data rate (SDR) to double data rate (DDR) converter 1310 according to aspects of the present disclosure. The SDR to DDR converter 1310 includes a first latching circuit 1320, a second latching circuit 1340, and a multiplexer 1360. The SDR to DDR converter 1310 has a first input 1312, a second input 1314, and an output 1316. The first input 1312 is configured to receive a first data signal, and the second input 1314 is configured to receive a second data signal. The first data signal may include odd data bits and the second data signal may include even data bits, or vice versa. The first data signal and the second data signal may each include one data bit per period of a clock signal (labeled "Clk"). Thus, in this example, each of the first data signal and the second data signal transmits data at a single data rate (i.e., one bit per period of the clock signal). The output 1316 of the SDR to DDR converter 1310 is coupled to the input 1042 of the signal path 1040.

The first latching circuit 1320 has a signal input 1322, a clock input 1324, a set input 1326, a reset input 1328, and an output 1330. The signal input 1322 is coupled to the first input 1312 of the SDR to DDR converter 1310, and the clock input 1324 is configured to receive the clock signal. The first latching circuit 1320 is configured to latch (i.e., capture) a logic value of the first data signal on a rising edge of the clock signal and output the latched logic value at the output 1330. Thus, in this example, the first latching circuit 1320 is a rising-edge triggered latching circuit (also referred to as a positive-edge triggered latching circuit).

The first latching circuit 1320 is configured to set when the set input 1326 is asserted (e.g., a logic one is input to the set input 1326). When the set input 1326 is asserted, the output 1330 is high (i.e., logic one). The first latching circuit 1320 is configured to reset when the reset input 1328 is asserted (e.g., a logic one is input to the reset input 1328). When the reset input 1328 is asserted, the output 1330 is low (i.e., logic zero).

The second latching circuit 1340 has a signal input 1342, a clock input 1344, a set input 1346, a reset input 1348, and an output 1350. The signal input 1342 is coupled to the second input 1314 of the SDR to DDR converter 1310, and the clock input 1344 is configured to receive the clock signal. The second latching circuit 1340 is configured to latch (i.e., capture) a logic value of the second data signal on a falling edge of the clock signal and output the latched logic value at the output 1350. Thus, in this example, the second latching circuit 1340 is a falling-edge triggered latching circuit (also referred to as a negative-edge triggered latching circuit).

The second latching circuit 1340 is configured to set when the set input 1346 is asserted (e.g., a logic one is input to the set input 1346). When the set input 1346 is asserted, the output 1350 is high (i.e., logic one). The second latching circuit 1340 is configured to reset when the reset input 1348 is asserted (e.g., a logic one is input to the reset input 1348). When the reset input 1348 is asserted, the output 1350 is low (i.e., logic zero).

The multiplexer 1360 has a first input 1362, a second input 1364, a select input 1366, and an output 1368. The first input 1362 is coupled to the output 1330 of the first latching circuit 1320, the second input 1364 is coupled to the output 1350 of the second latching circuit 1340, the select input 1366 is configured to receive the clock signal, and the output 1368 is coupled to the output 1316 of the SDR to DDR converter 1310.

The multiplexer 1360 is configured to couple the output 1330 of the first latching circuit 1320 to the output 1368 when the clock signal is high, and to couple the output 1350 of the second latching circuit 1340 to the output 1368 when the clock signal is low. Thus, for each period of the clock signal, the multiplexer 1360 outputs a latched data bit (e.g., odd data bit) from the output 1330 of the first latching circuit 1320 during a portion of the period when the clock signal is high, and outputs a latched data bit (e.g., even data bit) from the output 1350 of the second latching circuit 1340 during a portion of the period when the clock signal is low. Thus, the multiplexer 1360 outputs two data bits per period of the clock signal at the output 1316, and therefore outputs data bits at a double data rate at the output 1316.

Since the output 1316 of the SDR to DDR converter 1310 is coupled to the input 1042 of the signal path 1040, the SDR to DDR converter 1310 outputs data bits at double data rate to the signal path 1040. The output 1044 of the signal path 1040 may be coupled to a driver (e.g., the driver 1110), a sequential logic circuit (e.g., flip-flop), a processor, or another type of circuit.

In this example, the first output 1034 of the controller 1030 is coupled to the set input 1326 of the first latching circuit 1320 and the set input 1346 of the second latching circuit 1340. The second output 1036 of the controller 1030 is coupled to the reset input 1328 of the first latching circuit 1320 and the reset input 1348 of the second latching circuit 1340.

In the active mode (also referred to as functional mode), the controller 1030 de-asserts the set input 1326 and the reset input 1328 of the first latching circuit 1320 (e.g., inputs a logic zero to both the set input 1326 and the reset input 1328), and de-asserts the set input 1346 and the reset input 1348 of the second latching circuit 1340 (e.g., inputs a logic zero to both the set input 1346 and the reset input 1348). In this case, the first latching circuit 1320 latches logic values (i.e., data bits) of the first data signal on rising edges of the clock signal and outputs the latched logic values to the first input 1362 of the multiplexer 1360, and the second latching circuit 1340 latches logic values (i.e., data bits) of the second data signal on falling edges of the clock signal and outputs the latched logic values to the second input 1364 of the multiplexer 1360.

In the idle mode, the controller 1030 controls aging of the signal path 1040. The controller 1030 may determine that the signal path 1040 is in the idle mode when the input 1032 of the controller 1030 receives the indicator signal indicating the idle mode. In this example, the controller 1030 may park the input 1042 of the signal path 1040 high by asserting the set input 1326 of the first latching circuit 1320 and asserting the set input 1346 of the second latching circuit 1340 (e.g., by outputting a logic one at the first output 1034). The controller 1030 may park the input 1042 of the signal path 1040 low by asserting the reset input 1328 of the first latching circuit 1320 and asserting the reset input 1348 of the second latching circuit 1340 (e.g., by outputting a logic one at the second output 1036).

In the idle mode, the controller 1030 may control aging of the signal path 1040 using any of the techniques discussed above with reference to FIG. 2. For example, the controller 1030 may alternately park the input 1042 of the signal path 1040 low and high over multiple idle periods. In this example, the controller 1030 may park the input 1042 low during odd idle periods and high during even idle periods, or vice versa. In another example, the controller 1030 may control the aging of the signal path 1040 based on an aging pattern, as discussed above with reference to FIG. 10.

Although the SDR to DDR converter 1310 is discussed above using the example of a data signal, it is to be appreciated that the SDR to DDR converter 1310 may also be used for a control signal and an address signal.

Figure 14:
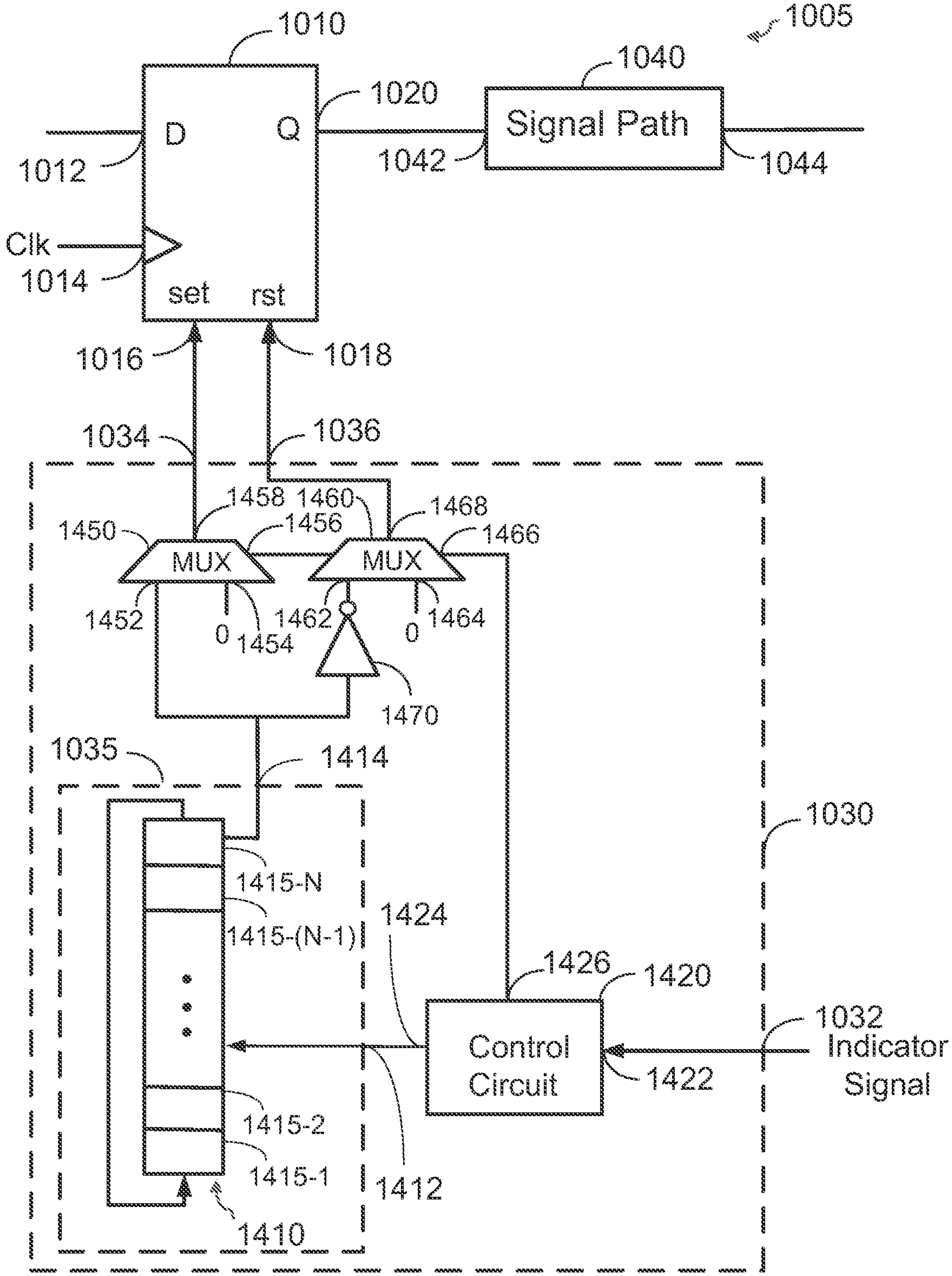
FIG. 14 shows an exemplary implementation of a controller according to certain aspects of the present disclosure.

As discussed above, the controller 1030 may control aging based on the sequence of N bits stored in the register 1035. In one example, the register 1035 may include a circular shift register configured to output one of the bits in the sequence at a time. In this regard, FIG. 14 shows an example in which the register 1035 includes a circular shift register 1410 according to certain aspects. In this example, the circular shift register 1410 includes storage slots 1415-1 to 1415-N, where each of the storage slots 1415-1 to 1415-N may hold one bit of the sequence of N bits. The circular shift register 1410 has an input 1412 and an output 1414. The input 1412 is used to control the shifting of bits in the circular shift register 1410, as discussed further below. The output 1414 is configured to output the bit in storage slot 415-N.

In this example, the controller 1030 also includes a first multiplexer 1450, a second multiplexer 1460, and an inverter 1470. The first multiplexer 1450 has a first input 1452 coupled to the output 1414 of the circular shift register 1410, a second input 1454 configured to receive a logic zero, an output 1458 coupled to the first output 1034 of the controller 1030, and an select input 1456. The second multiplexer 1460 has a first input 1462 coupled to the output 1414 of the circular shift register 1410 via the inverter 1470, a second input 1464 configured to receive a logic zero, an output 1468 coupled to the second output 1036 of the controller 1030, and an select input 1466.

The controller 1030 also includes a control circuit 1420. The control circuit 1420 has an input 1422, a first output 1424, and a second output 1426. The input 1422 is coupled to the input 1032 of the controller 1030 and is configured to receive the indicator signal discussed above. The first output 1424 is coupled to the input 1412 of the circular shift register 1410 and is used by the control circuit 1420 to shift the bits in the circular shift register 1410, as discussed further below. The second output 146 is coupled to the select input 1456 of the first multiplexer 1450 and the select input 1466 of the second multiplexer 1460.

In operation, the control circuit 1420 is configured to instruct each of the first multiplexer 1450 and the second multiplexer 1460 to select the respective second input 1454 and 1464 in the active mode via the second output 1426. This causes the first multiplexer 1450 and the second multiplexer 1460 to output a zero to the set input 1016 and the reset input 1018 of the latching circuit 1010, which de-asserts both the set input 1016 and the reset input 1018.

In operation, the control circuit 1420 is configured to instruct each of the first multiplexer 1450 and the second multiplexer 1460 to select the respective first input 1452 and 1462 in the idle mode via the second output 1426. This couples the set input 1016 to the output 1414 of the circular shift register 1410, and couples the reset input 1018 to the output 1414 of the circular shift register 1410 via the inverter 1470. Thus, the reset input 1018 receives the inverse of the bit output by the circular shift register 1410 in this example.

In the idle mode, the control circuit 1420 may be configured to shift the bits in the circular shift register 410 by one bit position for each idle period via the first output 1424 such that the circular shift register 410 outputs each bit in the sequence of N bits once every N idle periods. For example, the control circuit 1420 may shift the bits in the circular shift register 1410 by one bit position each time the indicator signal indicates the idle mode. For each shift, the bit in each storage slot 1415-1 to 1415-N may be shifted up to the next storage slot 1415-1 to 1415-N in the circular shift register 1410. For example, in one shift, the bit in storage slot 1415-1 may be shifted up to storage slot 1415-2, and the bit in storage slot 415-N may be shifted back to storage slot 1415-1 (as indicated by the arrow looping back from storage slot 1415-N to storage slot 1415-1).

Thus, in this example, the bits in the circular shift register 1410 are shifted by one bit position for each idle period such that the circular shift register 1410 cycles through the sequence of N bits once every N idle periods. In this example, the output 1020 of the latching circuit 1010 may be parked high when the circular shift register 1410 outputs a one. This is because the first multiplexer 1450 outputs the one to the set input 1016 of the latching circuit 1010 which asserts the set input 1016, and the second multiplexer outputs zero (i.e., inverse of one) to the reset input 1018 of the latching circuit 1010 which de-asserts the reset input 1018. Also, in this example, the output 1020 of the latching circuit 1010 may be parked low when the circular shift register 1410 outputs a zero. This is because the first multiplexer 1450 outputs the zero to the set input 1016 of the latching circuit 1010 which de-asserts the set input 1016, and the second multiplexer outputs one (i.e., inverse of zero) to the reset input 1018 of the latching circuit 1010 which asserts the reset input 1018.

In the example shown in FIG. 14, the inverter 1470 is coupled between the output 1414 of the circular shift register 1410 and the first input 1462 of the second multiplexer 1460. However, it is to be appreciated that the present disclosure is not limited to this example. In other implementations, the inverter 1470 may be coupled between the output 1414 of the circular shift register 1410 and the first input 1452 of the first multiplexer 1450. In this example, the output 1020 of the latching circuit 1010 may be parked low when the circular shift register 1410 outputs a one, and the output 1020 of the latching circuit 1010 may be parked high when the circular shift register 1410 outputs a zero.

Figure 15:
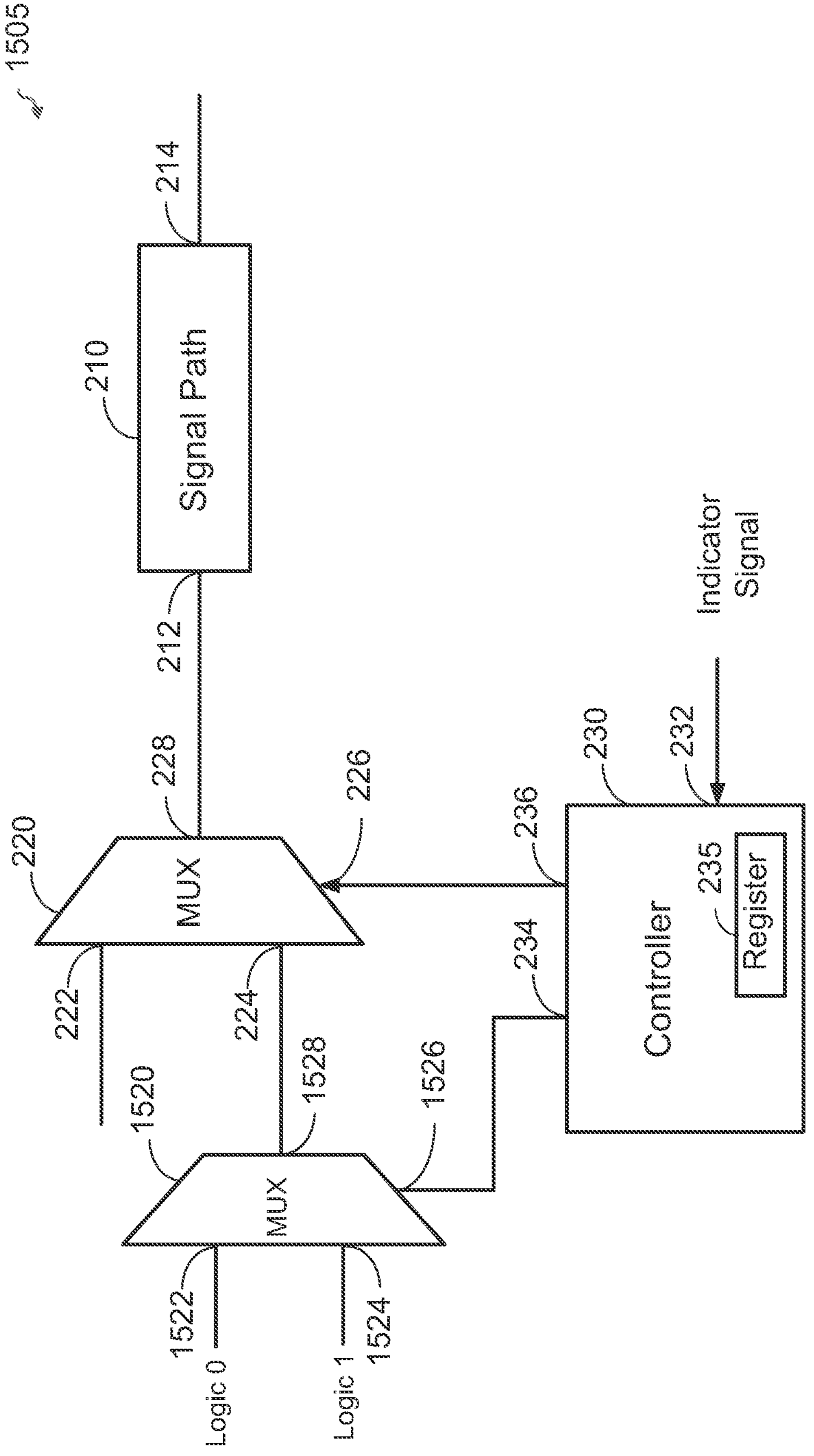
FIG. 15 shows an example of a multiplexer configured to output an aging control signal according to certain aspects of the present disclosure.

FIG. 15 shows another example of a system 1505 with aging mitigation according to certain aspects of the present disclosure. In this example, the system 1505 includes the signal path 210, the multiplexer 220, and the controller 230 discussed above. The system 1505 also includes a second multiplexer 1520. In the discussion of FIG. 15 below, the multiplexer 220 is referred to as the first multiplexer 220.

The second multiplexer 1520 has a first input 1522, a second input 1524, a select input 1526, and an output 1528. The output 1528 of the second multiplexer 1520 is coupled to the second input 224 of the first multiplexer 220, and the select input 1526 of the second multiplexer 1520 is coupled to the first output 234 of the controller 230. The first input 1522 of the second multiplexer 1520 is configured to receive a logic zero and the second input 1524 of the second multiplexer 1520 is configured to receive a logic one. For example, the first input 1522 may receive the logic zero by grounding the first input 1522 and the second input 1524 may receive the logic one by coupling the second input 1524 to a supply rail.

In the idle mode, the second multiplexer 1520 is configured to receive the aging control signal. As discussed above, in certain aspects, the aging control signal may alternative between one (i.e., high) and zero (i.e., low) over the multiple idle periods, or switch between one (i.e., high) and zero (i.e., low) based on an aging pattern. The second multiplexer 1520 may then select the logic zero at the first input 1522 or the logic one at the second input 1524 based on the logic state of the aging control signal and output the selected one of the logic zero and the logic one at the output 1528. For example, the second multiplexer 1520 may select the logic zero at the first input 1522 when the aging control signal is zero and select the logic one at the second input 1524 when the aging control signal is one, or vice versa.

In the idle mode, the first multiplexer 220 is configured to receive the selected one of the logic zero and the logic one from the second multiplexer 1520 at the second input 224. Since the second input 224 of the first multiplexer 220 is selected in the idle mode as discussed above, the first multiplexer 220 passes the selected one of the logic zero and the logic one to the input 212 of the signal path 210. For example, when the logic zero is selected, the input 212 of the signal path is parked low in the idle mode, and, when the logic one is selected, the input 212 of the signal path is parked high in the idle mode. Thus, in this example, the output of the second multiplexer 1520 provides the aging control signal to the second input 224 of the first multiplexer 220.

As discussed above, the signal path 210, the signal path 910, and the signal path 1040 may each include a delay circuit. For example, the signal path 210, the signal path 910, and the signal path 1040 may each include the delay circuit 115 including delay buffers 120-1 to 120-4 coupled in series. Although four delay buffers 120-1 to 120-4 are shown in the example in FIG. 1A, it is to be appreciated that a signal path may include a different number of delay buffers. Although FIG. 1A shows an example in which the delay buffers 120-1 to 120-4 are implemented with inverters, it is to be appreciate that the delay buffers 120-1 to 120-4 are not limited to this example, and that the delay buffers 120-1 to 120-4 may be implemented with other types of delay buffers.

In certain aspects, a signal path (e.g., the signal path 210, the signal path 910, or the signal path 1040) may include a delay circuit with an adjustable delay (e.g., to adjust the timing of a data signal and/or clock signal). For example, a delay circuit may include delay buffers and a switching circuit configured to control which of the delay buffers are coupled between the input and the output of the delay circuit. In this example, the delay of the delay circuit may be adjusted by controlling the number of the delay buffers that are coupled between the input and the output of the delay circuit using the switching circuit. The switching circuit may include switches, logic gates, a multiplexer, or any combination thereof.

Figure 16:
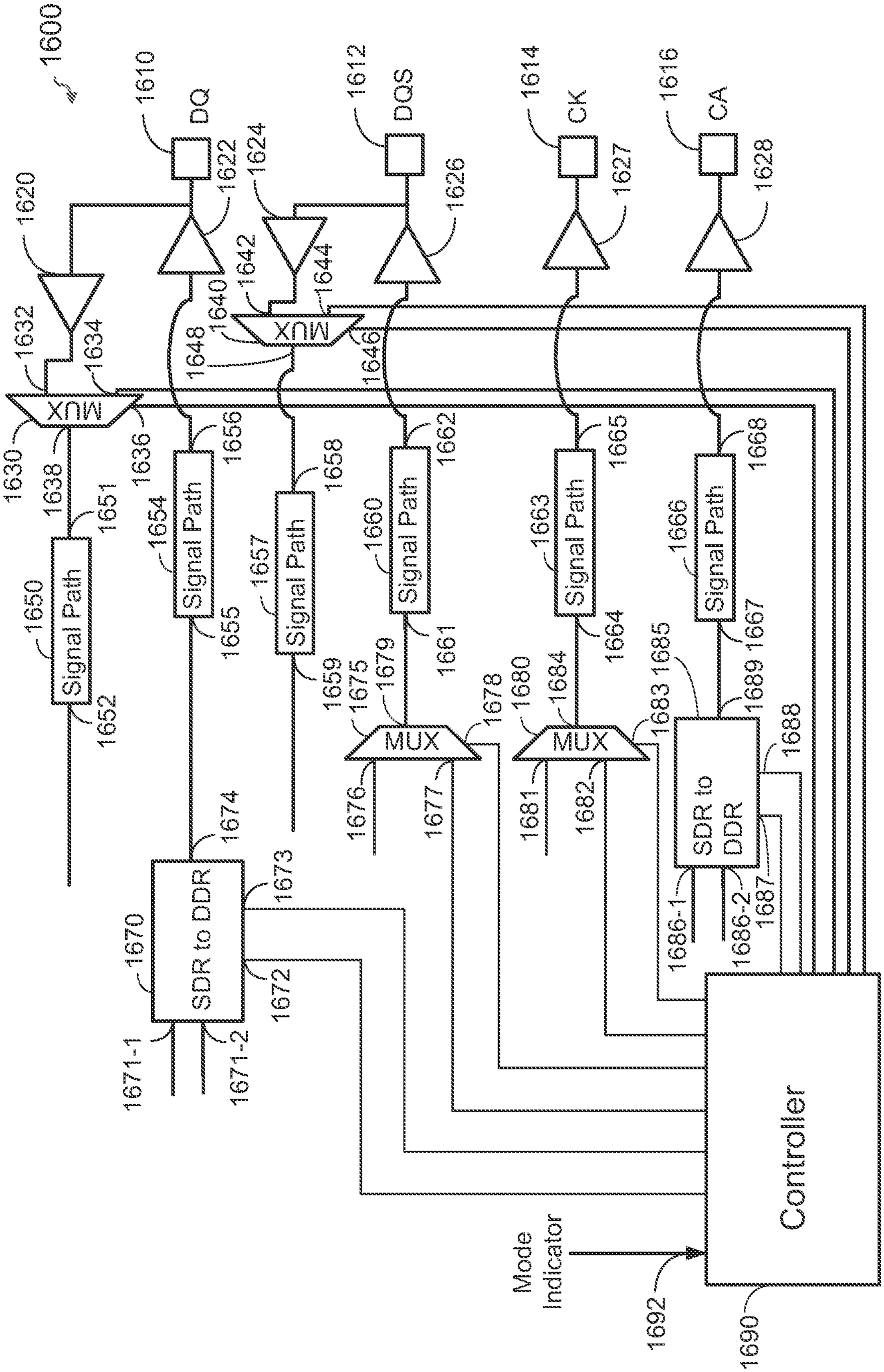
FIG. 16 shows an example of a memory interface circuit with aging control according to certain aspects of the present disclosure.

FIG. 16 shows an example of a memory interface circuit 1600 in which aging control according to aspects of the present disclosure may be used. However, it is to be appreciated that the present disclosure is not limited to the memory interface circuit 1600 and may be used in other types of circuits. The memory interface circuit 1600 may be configured to provide one or more processors (e.g., central processing unit (CPU) core, graphics processing unit (GPU), etc.) with access to a memory device (not shown). The memory device may be a double data rate (DDR) dynamic random-access memory (DRAM) or another type of memory device.

The memory interface circuit 1600 includes a controller 1690 configured to perform aging control operations for the memory interface circuit 1600, as discussed further below. The memory interface circuit 1600 also includes a first pad 1610, a second pad 1612, a third pad 1614, a fourth pad 1616, a first receiver 1620, a second receiver 1624, first driver 1622, a second driver 1626 a third driver 1627, and a fourth driver 1628. In the example in FIG. 16, the first pad 1610 is used for data signals (labeled "DQ"), the second pad 1612 is used for a data strobe signal (labeled "DQS"), the third pad 1614 is used for a clock signal (labeled "CK"), and the fourth pad 1616 is used for a command/address signal (labeled "CA"). The first pad 1610, the second pad 1612, the third pad 1614, and the fourth pad 1616 are coupled to the memory device (not shown) via respective metal lines (not used). Although one data line corresponding to the first pad 1610 is shown in FIG. 16 for ease of illustration, it is to be appreciated that the memory interface circuit 1600 may include multiple data lines in parallel for transmitting and/or receiving multiple data signals in parallel.

The input of the first receiver 1620 and the output of the first driver 1622 are coupled to the first pad 1610. The input of the second receiver 1624 and the output of the second driver 1626 are coupled to the second pad 1612. The output of the third driver 1627 is coupled to the third pad 1614, and the output of the fourth driver 1628 is coupled to the fourth pad 1616. The first receiver 1620 may be configured to receive a data signal from the memory device via the first pad 1610. The first receiver 1620 may be configured to amplify the received data signal. The first driver 1622 may be configured to receive a data signal and drive the first pad 1610 with the data signal to transmit the data signal to the memory device. The second receiver 1624 may be configured to receive a data strobe signal from the memory device via the second pad 1612. The second driver 1626 may be configured to receive a data strobe signal and drive the second pad 1612 with the data strobe signal to transmit the data strobe signal to the memory device. The data strobe signal may be a clock signal used for capturing data bits from the data signal. The third driver 1627 may be configured to receive a clock signal and drive the third pad 1614 with the clock signal to transmit the clock signal to the memory device. The fourth driver 1628 may be configured to receive a command/address (CA) signal and drive the fourth pad 1616 with the CA signal to transmit the CA signal to the memory device. In this example, the clock signal transmitted from the third pad 1614 may be used for capturing command bits and/or address bits from the CA signal.

The memory interface circuit 1600 also includes a first multiplexer 1630, a first signal path 1650, a second multiplexer 1640, a second signal path 1654, a second multiplexer 1640, a third signal path 1657, a third multiplexer 1675, a fourth signal path 1660, a fourth multiplexer 1680, a fifth signal path 1663, a sixth signal path 1666, a first SDR to DDR converter 1670, and a second SDR to DDR converter 1685. Each of the first signal path 1650, the second signal path 1654, the third signal path 1657, the fourth signal path 1660, the fifth signal path 1663, and the sixth signal path 1666 may be include a delay circuit (e.g., delay circuit 115) for delaying the respective signal.

The first multiplexer 1630 has a first input 1632 coupled to the output of the first receiver 1620, a second input 1634 coupled to the controller 1690, a select input 1636 coupled to the controller 1690, and an output 1638. The first signal path 1650 has an input 1651 coupled to the output 1638 of the first multiplexer 1630, and an output 1652.

The first SDR to DDR converter 1670 has a first signal input 1671-1 and a second signal input 1671-2 coupled to a data source (not shown). The first SDR to DDR converter 1670 also has a set input 1672 coupled to the controller 1690, a reset input 1673 coupled to the controller 1690, and an output 1674. The second signal path 1654 has an input 1655 coupled to the output 1674 of the first SDR to DDR converter 1670, and an output 1656 coupled to the input of the first driver 1622.

The second multiplexer 1640 has a first input 1642 coupled to the output of the second receiver 1624, a second input 1644 coupled to the controller 1690, a select input 1646 coupled to the controller 1690, and an output 1648. The third signal path 1657 has an input 1658 coupled to the output 1648 of the second multiplexer 1640, and an output 1659.

The third multiplexer 1675 has a first input 1676 coupled to the data strobe source (not shown), a second input 1677 coupled to the controller 1690, a select input 1678 coupled to the controller 1690, and an output 1679. The fourth signal path 1660 has an input 1661 coupled to the output 1679 of the third multiplexer 1675, and an output 1662 coupled to the input of the second driver 1626.

The fourth multiplexer 1680 has a first input 1681 coupled to a clock source (not shown), a second input 1682 coupled to the controller 1690, a select input 1683 coupled to the controller 1690, and an output 1684. The fifth signal path 1663 has an input 1664 coupled to the output 1684 of the fourth multiplexer 1680, and an output 1665 coupled to the input of the third driver 1627.

The second SDR to DDR converter 1685 has a first signal input 1686-1 and a second signal input 1686-2 coupled to a command/address source (not shown). The second SDR to DDR converter 1685 also has a set input 1687 coupled to the controller 1690, a reset input 1688 coupled to the controller 1690, and an output 1689. The sixth signal path 1666 has an input 1667 coupled to the output 1689 of the second SDR to DDR converter 1685, and an output 1668 coupled to the input of the fourth driver 1628.

Exemplary operations of the memory interface circuit 1600 will now be described according to certain aspects.

During a write operation, the first SDR to DDR converter 1670 may receive data to be written to the memory device. For example, the first SDR to DDR converter 1670 may receive the data in two or more data signals at a single data rate (SDR), in which a first one of the data signals may include odd data bits and a second one of the data signals may include even bits. In this example, the first SDR to DDR converter 1670 may receive the first one of the data signals via the first signal input 1671-1 and receive the second one of the data signals via the second signal input 1671-2.

The first SDR to DDR converter 1670 may convert the data signals at the SDR into a data signal at a double data rate (DDR) and output the data signal at the DDR at the output 1674. In one example, the first SDR to DDR converter 1670 may be implemented with the exemplary SDR to DDR converter 1310. The data signal at DDR propagates to the first driver 1622 via the second signal path 1654, and the first driver 1622 transmits the data signal at DDR to the memory device via the first pad 1610. In this example, the second signal path 1654 may delay the data signal (e.g., to align the data signal with other one or more data signals (not shown) in parallel data lines). As discussed above, the other data lines are not shown in FIG. 16 for ease of illustration.

During the write operation, the third multiplexer 1675 may receive a data strobe signal at the first input 1676. The controller 1690 instructs the third multiplexer 1675 to select the first input 1676 so that the third multiplexer 1675 outputs the data strobe signal to the fourth signal path 1660. The data strobe signal may have half the frequency of the data signal at DDR (i.e., the data signal at DDR includes two data bits per period of the data strobe signal). The data strobe signal propagates to the second driver 1626 via the fourth signal path 1660, and the second driver 1626 transmits the data strobe signal to the memory device via the second pad 1612. In this example, the fourth signal path 1660 may delay the data strobe signal (e.g., to adjust the timing of the data strobe signal relative to the data signal at DDR).

During a read operation, the first receiver 1620 may receive a data signal including read data from the memory device via the first pad 1610. The controller 1690 may instruct the first multiplexer 1630 to select the first input 1632 to allow the data signal to propagate through the first multiplexer 1630 to the first signal path 1650. The first signal path 1650 may output the read data to a memory controller (not shown), which may buffer the data in the data signal and send the data to a processor that requested the data from the memory device.

During the read operation, the second receiver 1624 may receive a data strobe signal from the memory device via the second pad 1612 and output the received data strobe signal to the first input 1642 of the second multiplexer 1640. The controller 1690 instructs the second multiplexer 1640 to select the first input 1642 so that the second multiplexer 1640 outputs the data strobe signal to the third signal path 1657. The data strobe signal propagates to the memory controller (not shown) via the third signal path 1657, in which the memory controller may use the data strobe signal to capture the read data in the data signal received from the memory device. In this example, the third signal path 1657 may delay the data strobe signal (e.g., to adjust the timing of the data strobe signal relative to the received data signal).

The second SDR to DDR converter 1685 may receive commands and/or address information for the memory device. For example, the second SDR to DDR converter 1685 may receive the commands and/or address information in two or more control/address (CA) signals at a single data rate (SDR), in which a first one of the CA signals may include odd bits and a second one of the CA signals may include even bits. In this example, the second SDR to DDR converter 1685 may receive the first one of the CA signals via the first signal input 1686-1 and the second one of the CA signals via the second signal input 1686-2.

The second SDR to DDR converter 1685 may convert the CA signals at the SDR into a CA signal at a double data rate (DDR) and output the CA signal at the DDR at the output 1689. In one example, the second SDR to DDR converter 1685 may be implemented with the exemplary SDR to DDR converter 1310. The CA signal at DDR propagates to the fourth driver 1628 via the sixth signal path 1666, and the fourth driver 1628 transmits the CA signal at DDR to the memory device via the fourth pad 1616.

The fourth multiplexer 1680 may receive a clock signal at the first input 1681. The controller 1690 instructs the fourth multiplexer 1680 to select the first input 1681 so that the fourth multiplexer 1680 outputs the clock signal to the fifth signal path 1663. The clock signal propagates to the third driver 1627 via the fifth signal path 1663, and the third driver 1627 transmits the clock signal to the memory device via the third pad 1614. The memory device may use the clock signal to capture the command/address bits from the CA signal.

For a write operation, the memory controller (not shown) may receive a request from a processor (not shown) to write data to the memory device. In response, the memory controller generates CA signals including a write command and a write address for the data to be written. The second SDR to DDR converter 1685 receives the CA signals at SDR via the first signal input 1686-1 and the second signal input 1686-2, and converts the CA signals at SDR into a CA signal at DDR and outputs the CA signal at DDR at the output 1689. The CA signal propagates through the sixth signal path 1666 to the fourth driver 1628, which transmits the CA signal to the memory device via the fourth pad 1616.

For a read operation, the memory controller (not shown) may receive a read request from a processor (not shown). In response, the memory controller generates a generates CA signals including a read command and a read address for the data to be read from the memory device. The second SDR to DDR converter 1685 receives the CA signals at SDR via the first signal input 1686-1 and the second signal input 1686-2, and converts the CA signals at SDR into a CA signal at DDR and outputs the CA signal at DDR at the output 1689. The CA signal propagates through the sixth signal path 1666 to the fourth driver 1628, which transmits the CA signal to the memory device via the fourth pad 1616.

The memory controller may also generate a CA signals including commands for performing housekeeping operations (e.g., refresh operation). In this case, the memory controller generates CA signals including housekeeping commands (e.g., refresh command) for the memory device. The second SDR to DDR converter 1685 receives the CA signals at SDR via the first signal input 1686-1 and the second signal input 1686-2, and converts the CA signals at SDR into a CA signal at DDR and outputs the CA signal at DDR at the output 1689. The CA signal propagates through the sixth signal path 1666 to the fourth driver 1628, which transmits the CA signal to the memory device via the fourth pad 1616.

The controller 1690 may be configured to perform aging control operations for the memory interface circuit 1600 based on the activity of the memory interface circuit 1600, as discussed further below. In certain aspects, the controller 1690 may receive one or more signal at an input 1692 indicating an operation of the memory interface circuit 1600. The controller 1690 may be implemented with one or more instances of the exemplary controller 230 and/or controller 1030 discussed above.

During a write operation, the first signal path 1650 and the third signal path 1657 may be idle while the second signal path 1654, the fourth signal path 1660, the fifth signal path 1663, and sixth signal path 1666 are active. In other words, the read data path and the read data strobe path (which include the first signal path 1650 and the third signal path 1657, respectively) may be in the idle mode during the write operation. In this case, the controller 1690 may receive a signal from the memory controller indicating the write operation. In response, the controller 1690 may perform an aging control operation for the first signal path 1650 and the third signal path 1657 while the second signal path 1654, the fourth signal path 1660, the fifth signal path 1663, and the sixth signal path 1666 are active.

In this regard, the controller 1690 may instruct the first multiplexer 1630 to select the second input 1634 via the select input 1636. The controller 1690 may then input an aging control signal to the second input 1634 of the first multiplexer 1630 to control aging of the first signal path 1650 (e.g., using any of the exemplary techniques discussed above). For example, the aging control signal may alternately park the input 1651 of the first signal path 1650 high and low over multiple idle periods, control aging of the first signal path 1650 based on an aging pattern (e.g., stored in the circular shift register 410), etc.

The controller 1690 may also instruct the second multiplexer 1640 to select the second input 1644 via the select input 1646. The controller 1690 may then input an aging control signal to the second input 1644 of the second multiplexer 1640 to control aging of the third signal path 1657 (e.g., using any of the exemplary techniques discussed above). For example, the aging control signal may alternately park the input 1658 of the third signal path 1657 high and low over multiple idle periods, control aging of the third signal path 1657 based on an aging pattern (e.g., stored in the circular shift register 410), etc.

During a read operation, the second signal path 1654 and the fourth signal path 1660 may be idle while the first signal path 1650, the third signal path 1657, the fifth signal path 1663, and the sixth signal path 1666 are active. In other words, the write data path and the write data strobe path (which include the second signal path 1654 and the fourth signal path 1660, respectively) may be in the idle mode during the read operation. In this case, the controller 1690 may receive a signal from the memory controller indicating the read operation. In response, the controller 1690 may perform an aging control operation for the second signal path 1654 and the fourth signal path 1660 while the first signal path 1650, the third signal path 1657, the fifth signal path 1663, and the sixth signal path 1666 are active.

In this regard, the controller 1690 may control aging of the second signal path 1654 using the set input 1672 and the reset input 1673 of the first SDR to DDR converter 1670 (e.g., using any of the exemplary techniques discussed above). For example, the controller 1690 may park the input 1655 of the second signal path 1654 high by asserting the set input 1672, and park the input 1655 of the second signal path 1654 low by asserting the reset input 1673. In this example, the controller 1690 may control aging, for example, by alternately parking the input 1655 of the second signal path 1654 high and low over multiple idle periods of the second signal path 1654. In another example, the controller 1690 may control aging of the second signal path 1654 based on an aging pattern.

The controller 1690 may also instruct the third multiplexer 1675 to select the second input 1677 via the select input 1678. The controller 1690 may then input an aging control signal to the second input 1677 of the third multiplexer 1675 to control aging of the fourth signal path 1660 (e.g., using any of the exemplary techniques discussed above). For example, the aging control signal may alternately park the input 1661 of the fourth signal path 1660 high and low over multiple idle periods, control aging of the fourth signal path 1660 based on an aging pattern (e.g., stored in the circular shift register 410), etc.

During a housekeeping operation (e.g., refresh operation), the first signal path 1650, the second signal path 1654, the third signal path 1657, and the fourth signal path 1660 associated with read and write operations may be idle while the fifth signal path 1663 and the sixth signal path 1666 may be active to send housekeeping commands (e.g., refresh commands) to the memory device. In other words, the write data path, write data strobe path, the read data path, and the read data strobe path may be idle during the housekeeping operation. In this case, the controller 1690 may receive a signal indicating housekeeping operation from the memory controller. In response, the controller 1690 may perform aging control operations for the first signal path 1650, the second signal path 1654, the third signal path 1657, and the fourth signal path 1660. For example, the controller 1690 may perform aging control operations for the first signal path 1650 and the third signal path 1657 in the manner discussed above for the write operation. The controller 1690 may also perform aging control operations for second signal path 1654 and the fourth signal path 1660 in the manner discussed above for the read operation.

During a traffic idle mode or clock stop power down (CSPD) mode, the CA, CK, DQ and DQS paths are all idle. In this case, the controller 1690 may receive a signal indicating traffic idle mode or CSPD mode from the memory controller. In response, the controller 1690 may perform aging control operations for the first signal path 1650, the second signal path 1654, the third signal path 1657, the fourth signal path 1660, the fifth signal path 1663, and the sixth signal path 1666. The controller 1690 may perform aging control operations for the first signal path 1650, the second signal path 1654, the third signal path 1657, and the fourth signal path 1660 in the manner discussed above.

The controller 1690 may control aging of the sixth signal path 1666 using the set input 1687 and the reset input 1688 of the second SDR to DDR converter 1685 (e.g., using any of the exemplary techniques discussed above). For example, the controller 1690 may park the input 1667 of the sixth signal path 1666 high by asserting the set input 1687, and park the input 1667 of the sixth signal path 1666 low by asserting the reset input 1688. In this example, the controller 1690 may control aging, for example, by alternately parking the input 1667 of the sixth signal path 1666 high and low over multiple idle periods. In another example, the controller 1690 may control aging of the sixth signal path 1666 based on an aging pattern.

The controller 1690 may also instruct the fourth multiplexer 1680 to select the second input 1682 via the select input 1683. The controller 1690 may then input an aging control signal to the second input 1682 of the fourth multiplexer 1680 to control aging of the fifth signal path 1663 (e.g., using any of the exemplary techniques discussed above). For example, the aging control signal may alternately park the input 1664 of the fifth signal path 1663 high and low over multiple idle periods, control aging of the fifth signal path 1663 based on an aging pattern (e.g., stored in the circular shift register 410), etc.

During a clock free running mode, the clock signal may be running with no command traffic. This may be done, for example, to keep the memory device synchronized with the clock signal. In this mode, the fifth signal path 1663 stays active for the clock signal while the first signal path 1650, the second signal path 1654, the third signal path 1657, the fourth signal path 1660, and the sixth signal path 1666 are idle. In this case, the controller 1690 may receive a signal indicating the clock free running mode from the memory controller. In response, the controller 1690 may perform aging control operations for the first signal path 1650, the second signal path 1654, the third signal path 1657, the fourth signal path 1660, and the sixth signal path 1666 in the manner discussed above.

Figure 17:
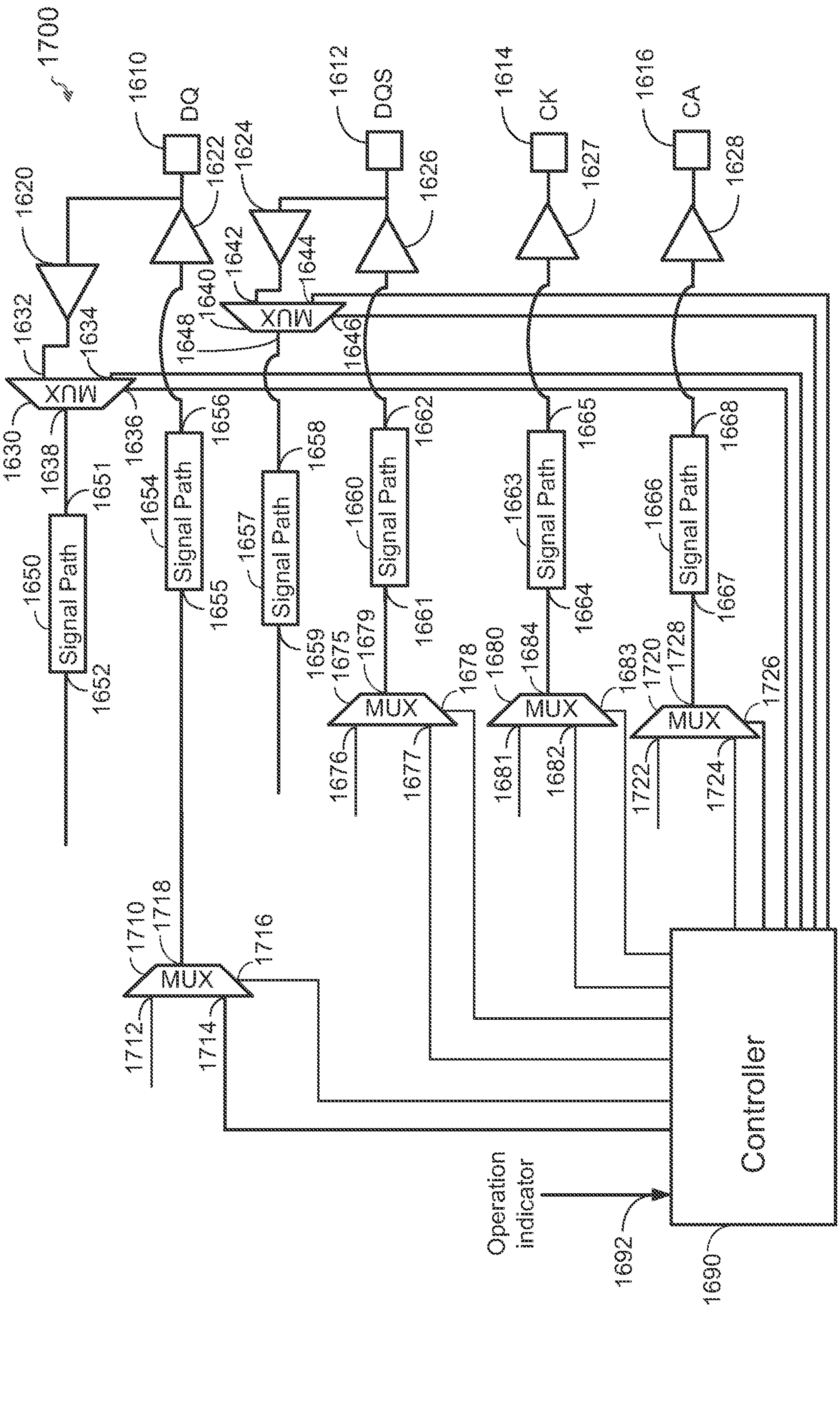
FIG. 17 shows another example of a memory interface circuit with aging control according to certain aspects of the present disclosure.

FIG. 17 shows another example of a memory interface circuit 1900 in which aging control according to aspects of the present disclosure may be used. The memory interface circuit 1900 includes the first multiplexer 1630, the second multiplexer 1640, the third multiplexer 1675, the fourth multiplexer 1680, the first signal path 1650, the second signal path 1654, the third signal path 1657, the fourth signal path 1660, the fifth signal path 1663, the sixth signal path 1666, the first receiver 1620, the second receiver 1624, the first driver 1622, the second driver 1626, the third driver 1627, the fourth driver 1628, the first pad 1610, the second pad 1612, the third pad 1614, the fourth pad 1616, and the controller 1690 discussed above. The memory interface circuit 1900 also includes a fifth multiplexer 1710 and a sixth multiplexer 1720.

The fifth multiplexer 1710 has a first input 1712 configured to receive a data signal, a second input 1714 coupled to the controller 1690, a select input 1716 coupled to the controller 1690, and an output 1718 coupled to the input 1655 of the second signal path 1654. In one example, the first input 1712 may receive the data signal from the first SDR to DDR converter 1670 (not shown in FIG. 17) in which the first input 1712 of the fifth multiplexer 1710 is coupled to the output 1674 of the first SDR to DDR converter 1670. However, it is to be appreciated that the present disclosure is not limited to this example.

The sixth multiplexer 1720 has a first input 1722 configured to receive a CA signal, a second input 1724 coupled to the controller 1690, a select input 1726 coupled to the controller 1690, and an output 1728 coupled to the input 1667 of the sixth signal path 1666. In one example, the first input 1722 may receive the data signal from the second SDR to DDR converter 1685 (not shown in FIG. 17) in which the first input 1722 of the sixth multiplexer 1720 is coupled to the output 1689 of the second SDR to DDR converter 1685. However, it is to be appreciated that the present disclosure is not limited to this example.

During a write operation, the controller 1690 instructs the fifth multiplexer 1710 to select the first input 1712 via the select input 1716. This allows the fifth multiplexer 1710 to receive a data signal including data to be written to the memory device, and to pass the data signal to the input 1655 of the second signal path 1654.

During a read operation, a housekeeping operation, the traffic idle mode, or the CSPD mode, the controller 1690 may instruct the instruct the fifth multiplexer 1710 to select the second input 1714 via the select input 1716. The controller 1690 may then input an aging control signal to the second input 1714 of the fifth multiplexer 1710 to control aging of the second signal path 1654 (e.g., using any of the exemplary techniques discussed above). For example, the aging control signal may alternately park the input 1655 of the second signal path 1654 high and low over multiple idle periods, control aging of the second signal path 1654 based on an aging pattern (e.g., stored in the circular shift register 410), etc.

During a read operation, a write operation, or a housekeeping operation, the controller 1690 may instruct the instruct the sixth multiplexer 1720 to select the first input 1722 via the select input 1726. This allows the sixth multiplexer 1720 to receive a CA signal including commands and/or address information, and to pass the CA signal to the input 1667 of the sixth signal path 1666.

During the traffic idle mode, the CSPD mode, or the clock free running mode, the controller 1690 may instruct the instruct the sixth multiplexer 1720 to select the second input 1724 via the select input 1726. The controller 1690 may then input an aging control signal to the second input 1724 of the sixth multiplexer 1720 to control aging of the sixth signal path 1666 (e.g., using any of the exemplary techniques discussed above). For example, the aging control signal may alternately park the input 1667 of the sixth signal path 1666 high and low over multiple idle periods, control aging of the sixth signal path 1666 based on an aging pattern (e.g., stored in the circular shift register 410), etc.

Figure 18:
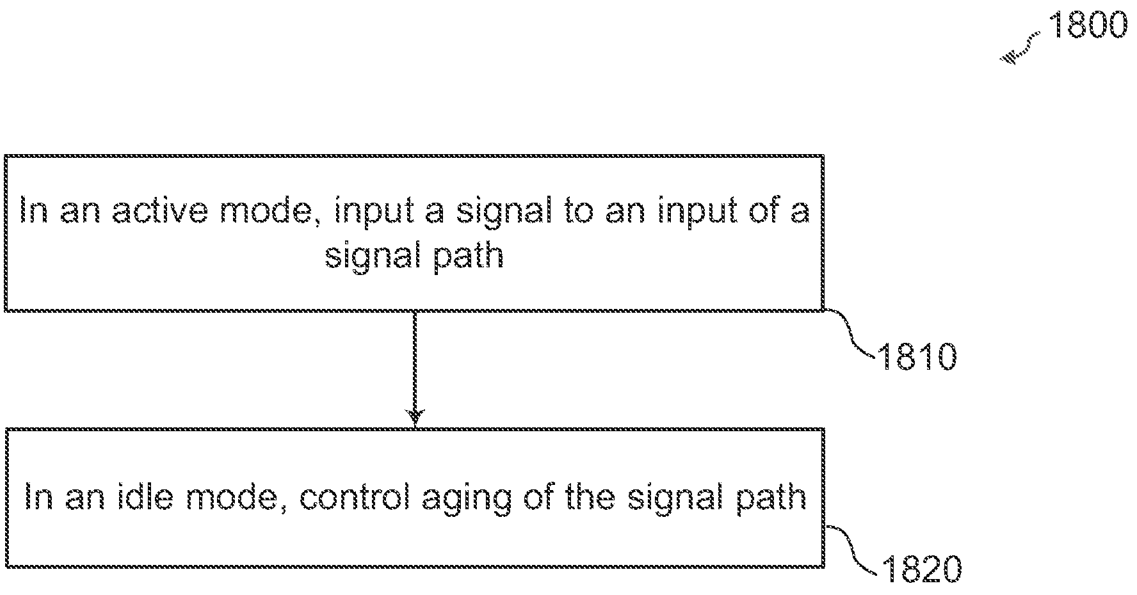
FIG. 18 is a flowchart illustrating a method of aging control according to certain aspects of the present disclosure.

FIG. 18 is a flowchart illustrating a method 1800 for aging control according to certain aspects.

At block 1810, in an active mode, a signal is input to an input of a signal path. For example, the signal may include a data signal, a clock signal, a control signal, or an address signal. The signal path may correspond to any one of the signal path 210, the signal path 1040, the first signal path 1650, the second signal path 1654, the third signal path 1657, the fourth signal path 1660, the fifth signal path 1663, or the sixth signal path 1666. The signal path may include a delay circuit (e.g., delay circuit 115). In some examples, the signal may be input to the signal path by a multiplexer (e.g., multiplexer 220, multiplexer 920, the first multiplexer 1630, the second multiplexer 1640, the third multiplexer 1675, the fourth multiplexer 1680, the fifth multiplexer 1710, or the sixth multiplexer 1720) or a latching circuit (e.g., the latching circuit 1010, the first latching circuit 1320, or the second latching circuit 1340).

At block 1820, in an idle mode, aging of the signal path is controlled. The aging may be controlled by a controller (e.g., controller 230, 1030, or 1690).

In certain aspects, controlling the aging of the signal in the idle mode includes alternately parking the input of the signal high and low over multiple consecutive idle periods. In certain aspects, the consecutive idle periods include odd idle periods and even idle periods. In these aspects, alternately parking the input of the signal path high and low may include parking the input of the signal path low during each of the odd idle periods, and parking the input of the signal path high during each of the even idle periods, or may include parking the input of the signal path high during each of the odd idle periods, and parking the input of the signal path low during each of the even idle periods.

In certain aspects, controlling aging of the signal path in the idle mode includes parking the input of the signal path high for k of N consecutive idle periods, and parking the input of the signal path low for N-k of the N consecutive idle periods, wherein k is an integer equal to or greater than one, and N is an integer greater than k.

In certain aspects, the method 1800 may also include storing a sequence of bits in a register (e.g., register 235 or the register 1035), each of the bits in the sequence of bits corresponding to a respective one of N consecutive idle periods in the idle mode. In these aspects, controlling aging of the signal path in the idle mode may include, for each one of the N consecutive idle periods, parking the input of the signal path high during the idle period if the corresponding bit in the sequence of bits has a first bit value, and parking the input of the signal path low during the idle period if the corresponding bit in the sequence of bits has a second bit value. The first bit value may be one and the second bit value may be zero, or the first bit value may be zero and the second logic bit may be one.

In certain aspects, controlling aging of the signal path in the idle mode includes inputting a clock signal to the input of the signal path. The clock signal may correspond to the slow clock signal discussed above with reference to FIG. 3B.

Implementation examples are described in the following numbered clauses:

1. A system, comprising:
   - a multiplexer having a first input, a second input, a select input, and an output;
   - a signal path having an input and an output, wherein the input of the signal path is coupled to the output of the multiplexer; and
   - a controller coupled to the second input of the multiplexer and the select input of the multiplexer, wherein the controller has an indicator input, and the controller is configured to:
   - receive a mode indicator signal at the indicator input;
   - if the mode indicator signal has a first logic value, instruct the multiplexer to select the first input of the multiplexer; and
   - if the mode indicator signal has a second logic value, instruct the multiplexer to select the second input of the multiplexer, and output a control signal to the second input of the multiplexer, the control signal controlling whether the input of the signal path is parked high or low.
2. The system of clause 1, wherein the first input of the multiplexer is configured to receive a data signal, a clock signal, a command signal, or an address signal.
3. The system of clause 1 or 2, wherein the signal path comprises a delay circuit.
4. The system of clause 3, wherein the delay circuit comprises delay buffers coupled in series.

5. The system of any one of clauses 1 to 4, wherein the first logic value indicates the system is in an active mode, and the second logic value indicates the system is in an idle mode.

6. The system of any one of clauses 1 to 5, wherein, when the mode indicator signal has the second logic value, the controller is configured to alternately set the control signal high and low over multiple consecutive idle periods.

7. The system of clause 6, wherein the consecutive idle periods include odd idle periods and even idle periods, and the controller is configured to:

set the control signal low during each of the odd idle periods; and set the control signal high during each of the even idle periods.

8. The system of clause 6, wherein the consecutive idle periods include odd idle periods and even idle periods, and the controller is configured to:

set the aging control signal high during each of the odd idle periods; and set the aging control signal low during each of the even idle periods.

9. The system of any one of clauses 1 to 5, wherein, when the mode indicator signal has the second logic value, the controller is configured to:

set the control signal high for k of N consecutive idle periods; and set the control signal low for N-k of the N consecutive idle periods;

wherein k is an integer equal to or greater than one, and N is an integer greater than k.

10. The system of any one of clauses 1 to 5, wherein the controller is configured to store a sequence of bits in a register, each of the bits in the sequence of bits corresponding to a respective one of N consecutive idle periods in an idle mode, and wherein, for each one of the N consecutive idle periods, the controller is configured to:

set the control signal high during the idle period if the corresponding bit in the sequence of bits has a first bit value; and set the control signal low during the idle period if the corresponding bit in the sequence of bits has a second bit value.

11. The system of any one of clauses 1 to 5, wherein the control signal comprises a clock signal.

12. The system of any one of clauses 1 to 11, further comprising:

a pad; and a receiver having an input and an output, wherein the input of the receiver is coupled to the pad, and the output of the receiver is coupled to the first input of the multiplexer.

13. The system of any one of clauses 1 to 12, further comprising:

a pad; and a driver having an input and an output, wherein the input of the driver is coupled to the output of the signal path, and the output of the driver is coupled to the pad.

14. The system of any one of clauses 1 to 12, further comprising:

a latching circuit having a signal input, a clock input, and an output, wherein the signal input is coupled to the output of the signal path.

15. The system of any one of clauses 1 to 12, further comprising:

a latching circuit having a signal input, a clock input, and an output, wherein the clock input is coupled to the output of the signal path.

16. The system of any one of clauses 1 to 10 and 12 to 15, wherein the controller comprises:

a circular shift register having an input and an output, wherein the output of the circular shifter register is coupled to the second input of the multiplexer; and a control circuit having an input, a first output, and a second output, wherein the input of the control circuit is coupled to the indicator input, the first output of the control circuit is coupled to the select input of the multiplexer, and the second output of the control circuit is coupled to the input of the circular shift register.

17. The system of clause 16, wherein:

the circular shifter register is configured to store bits and to output one of the bits at a time at the output of the circular shift register;

the control circuit is configured to:

receive the mode indicator signal via the input of the control circuit;

if the mode indicator signal has the first logic value, instruct the multiplexer to select the first input; and if the mode indicator signal has the second logic value, instruct the multiplexer to select the second input via the first output, and instruct the circular shift register to shift the bits in the circular shift register via the second output.

18. A system, comprising:

a latching circuit having a signal input, a clock input, a set input, a reset input, and an output;

a signal path having an input and an output, wherein the input of the signal path is coupled to the output of the latching circuit; and a controller coupled to the set input and the reset input of the latching circuit, wherein the controller has an indicator input, and the controller is configured to:

receive a mode indicator signal at the indicator input;

if the mode indicator signal has a first logic value, de-assert the set input and the reset input; and if the mode indicator signal has a second logic value, control whether the input of the signal path is parked high or low using the set input and the reset input.

19. The system of clause 18, wherein the first logic value indicates the system is in an active mode, and the second logic value indicates the system is in an idle mode.

20. The system of clause 18 or 19, wherein the signal input of the latching circuit is configured to receive a data signal, a command signal, or an address signal.

21. The system of any one of clauses 18 to 20, wherein the signal path comprises a delay circuit.

22. The system of clause 21, wherein the delay circuit comprises delay buffers coupled in series.

23. The system of any one of clauses 18 to 22, wherein, when the mode indicator has the second logic value, the controller is configured to alternately assert the set input and the reset input over multiple consecutive idle periods.

24. The system of clause 23, wherein the consecutive idle periods include odd idle periods and even idle periods, and the controller is configured to:

assert the set input during each of the odd idle periods; and assert the reset input during each of the even idle periods.

25. The system of clause 23, wherein the consecutive idle periods include odd idle periods and even idle periods, and the controller is configured to:

assert the reset input during each of the odd idle periods; and assert the set input during each of the even idle periods.

26. The system of any one of clauses 18 to 22, wherein, when the mode indicator signal has the second logic value, the controller is configured to:

assert the set input for k of N consecutive idle periods; and assert the reset input for N-k of the N consecutive idle periods;

wherein k is an integer equal to or greater than one, and N is an integer greater than k.

27. The system of any one of clauses 18 to 22, wherein the controller is configured to store a sequence of bits in a register, each of the bits in the sequence of bits corresponding to a respective one of N consecutive idle periods in an idle mode, and wherein, for each one of the N consecutive idle periods, the controller is configured to:

assert the set input during the idle period if the corresponding bit in the sequence of bits has a first bit value; and assert the reset input during the idle period if the corresponding bit in the sequence of bits has a second bit value.

28. The system of any one of clauses 18 to 27, further comprising:

a pad; and a receiver having an input and an output, wherein the input of the receiver is coupled to the pad, and the output of the receiver is coupled to the signal input of the latching circuit.

29. The system of any one of clauses 18 to 28, further comprising:

a pad; and a driver having an input and an output, wherein the input of the driver is coupled to the output of the signal path, and the output of the driver is coupled to the pad.

30. A method for aging control, comprising:

in an active mode, inputting a signal to an input of the signal path; and in an idle mode, controlling aging of the signal path.

31. The method of clause 30, wherein the signal comprises a data signal, a clock signal, a control signal, or an address signal.

32. The method of clause 30 or 31, wherein the signal path comprises a delay circuit.

33. The method of clause 32, wherein the delay circuit comprises delay buffers coupled in series 34. The method of any one of clauses 30 to 33, wherein controlling the aging of the signal in the idle mode comprises alternately parking the input of the signal high and low over multiple consecutive idle periods.

35. The method of clause 34, wherein the consecutive idle periods include odd idle periods and even idle periods, and alternately parking the input of the signal path high and low comprises:

parking the input of the signal path low during each of the odd idle periods; and parking the input of the signal path high during each of the even idle periods.

36. The method of clause 34, wherein the consecutive idle periods include odd idle periods and even idle periods, and alternately parking the input of the signal path high and low comprises:

parking the input of the signal path high during each of the odd idle periods; and parking the input of the signal path low during each of the even idle periods.

37. The method of any one of clauses 30 to 33, wherein controlling aging of the signal path in the idle mode comprises:

parking the input of the signal path high for k of N consecutive idle periods; and parking the input of the signal path low for N-k of the N consecutive idle periods;

wherein k is an integer equal to or greater than one, and N is an integer greater than k.

38. The method of any one of clauses 30 to 33, further comprising storing a sequence of bits in a register, each of the bits in the sequence of bits corresponding to a respective one of N consecutive idle periods in the idle mode, and wherein controlling aging of the signal path in the idle mode comprises, for each one of the N consecutive idle periods:

parking the input of the signal path high during the idle period if the corresponding bit in the sequence of bits has a first bit value; and parking the input of the signal path low during the idle period if the corresponding bit in the sequence of bits has a second bit value.

39. The method of any one of clauses 30 to 33, wherein controlling aging of the signal path comprises inputting a clock signal to the input of the signal path.

It is to be appreciated that the present disclosure is not limited to the exemplary terminology used above to describe aspects of the present disclosure. For example, a delay circuit may also be referred to as a delay line, a delay chain, a delay element, or another term. In another example, a pad may also be referred to as a pin, or another term. It is also to be appreciated that the indictor signal may also be referred to as a mode indictor signal.

The controller 230, the controller 1030, and the controller 1690 may each be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Within the present disclosure, the word “exemplary” is used to mean “serving as an example, instance, or illustration.” Any implementation or aspect described herein as “exemplary” is not necessarily to be construed as preferred or advantageous over other aspects of the disclosure. Likewise, the term “aspects” does not require that all aspects of the disclosure include the discussed feature, advantage or mode of operation. The term “coupled” is used herein to refer to the direct or indirect electrical coupling between two structures. It is also to be appreciated that the term “ground” may refer to a DC ground or an AC ground, and thus the term “ground” covers both possibilities.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure.

Thus, the disclosure is not intended to be limited to the examples described herein but is to be accorded the widest scope consistent with the principles and novel features disclosed herein.

What is claimed is:

1. A system, comprising:

a multiplexer having a first input, a second input, a select input, and an output, wherein the first input of the multiplexer is configured to receive a clock signal;

a signal path having an input and an output, wherein the input of the signal path is coupled to the output of the multiplexer; and a controller coupled to the second input of the multiplexer and the select input of the multiplexer, wherein the controller has an indicator input, and the controller is configured to:

receive a mode indicator signal at the indicator input;

if the mode indicator signal has a first logic value, instruct the multiplexer to select the first input of the multiplexer; and if the mode indicator signal has a second logic value, instruct the multiplexer to select the second input of the multiplexer, output a control signal to the second input of the multiplexer, and alternately set the control signal high and low over multiple consecutive idle periods.

2. The system of claim 1, wherein the signal path comprises a delay circuit.

3. The system of claim 2, wherein the delay circuit comprises delay buffers coupled in series.

4. The system of claim 1, wherein the first logic value indicates the system is in an active mode, and the second logic value indicates the system is in an idle mode.

5. The system of claim 1, wherein the consecutive idle periods include odd idle periods and even idle periods, and the controller is configured to:

set the control signal low during each of the odd idle periods; and set the control signal high during each of the even idle periods.

6. The system of claim 1, wherein the consecutive idle periods include odd idle periods and even idle periods, and the controller is configured to:

set the control signal high during each of the odd idle periods; and set the control signal low during each of the even idle periods.

7. The system of claim 1, further comprising:

a pad; and a receiver having an input and an output, wherein the input of the receiver is coupled to the pad, and the output of the receiver is coupled to the first input of the multiplexer.

8. The system of claim 1, further comprising:

a pad; and a driver having an input and an output, wherein the input of the driver is coupled to the output of the signal path, and the output of the driver is coupled to the pad.

9. The system of claim 1, further comprising:

a latching circuit having a signal input, a clock input, and an output, wherein the clock input is coupled to the output of the signal path.

10. The system of claim 1, further comprising:

a driver; and a clock gating circuit coupled between the output of the signal path and an input of the driver, wherein the controller is configured to un-gate the clock gating circuit if the mode indicator has the first logic value, and gate the clock gating circuit if the mode indicator has the second logic value.

11. The system of claim 10, wherein the first logic value indicates the system is in an active mode, and the second logic value indicates the system is in an idle mode.

12. A system, comprising:

a multiplexer having a first input, a second input, a select input, and an output, wherein the first input of the multiplexer is configured to receive a clock signal;

a signal path having an input and an output, wherein the input of the signal path is coupled to the output of the multiplexer; and a controller coupled to the second input of the multiplexer and the select input of the multiplexer, wherein the controller has an indicator input, and the controller is configured to:

receive a mode indicator signal at the indicator input;

if the mode indicator signal has a first logic value, instruct the multiplexer to select the first input of the multiplexer; and if the mode indicator signal has a second logic value, instruct the multiplexer to select the second input of the multiplexer, output a control signal to the second input of the multiplexer, set the control signal high for k of N consecutive idle periods, and set the control signal low for N-k of the N consecutive idle periods, wherein k is an integer equal to or greater than one, and N is an integer greater than k.

13. The system of claim 12, wherein the controller is configured to store a sequence of bits in a register, each of the bits in the sequence of bits corresponding to a respective one of the N consecutive idle periods in an idle mode, and wherein, for each one of the N consecutive idle periods, the controller is configured to:

set the control signal high during the idle period if the corresponding bit in the sequence of bits has a first bit value; and set the control signal low during the idle period if the corresponding bit in the sequence of bits has a second bit value.

14. The system of claim 12, wherein the controller comprises:

a circular shift register having an input and an output, wherein the output of the circular shifter register is coupled to the second input of the multiplexer; and a control circuit having an input, a first output, and a second output, wherein the input of the control circuit is coupled to the indicator input, the first output of the control circuit is coupled to the select input of the multiplexer, and the second output of the control circuit is coupled to the input of the circular shift register.

15. The system of claim 14, wherein:

the circular shifter register is configured to store bits, each of the bits corresponding to a respective one of the N consecutive idle periods, and to output one of the bits at a time at the output of the circular shift register;

the control circuit is configured to:

receive the mode indicator signal via the input of the control circuit;

if the mode indicator signal has the first logic value, instruct the multiplexer to select the first input; and if the mode indicator signal has the second logic value, instruct the multiplexer to select the second input via the first output, and instruct the circular shift register to shift the bits in the circular shift register via the second output.

16. The system of claim 12, further comprising:

a driver; and a clock gating circuit coupled between the output of the signal path and an input of the driver, wherein the controller is configured to un-gate the clock gating circuit if the mode indicator has the first logic value, and gate the clock gating circuit if the mode indicator has the second logic value.

17. The system of claim 16, wherein the first logic value indicates the system is in an active mode, and the second logic value indicates the system is in an idle mode.

18. A system, comprising:

a latching circuit having a signal input, a clock input, a set input, a reset input, and an output, wherein the latching circuit is configured to latch a logic value at the signal input on an edge of a clock signal input to the clock input when the set input and the reset input are de-asserted, and output the latched logic value at the output of the latching circuit;

a signal path having an input and an output, wherein the input of the signal path is coupled to the output of the latching circuit; and a controller coupled to the set input and the reset input of the latching circuit, wherein the controller has an indicator input, and the controller is configured to:

receive a mode indicator signal at the indicator input;

if the mode indicator signal has a first logic value, de-assert the set input and the reset input; and if the mode indicator signal has a second logic value, alternately assert the set input and the reset input over multiple consecutive idle periods.

19. The system of claim 18, wherein the first logic value indicates the system is in an active mode, and the second logic value indicates the system is in an idle mode.

20. The system of claim 18, wherein the signal input of the latching circuit is configured to receive a data signal, a command signal, or an address signal.

21. The system of claim 18, wherein the signal path comprises a delay circuit.

22. The system of claim 21, wherein the delay circuit comprises delay buffers coupled in series.

23. The system of claim 18, wherein the consecutive idle periods include odd idle periods and even idle periods, and the controller is configured to:

assert the set input during each of the odd idle periods; and assert the reset input during each of the even idle periods.

24. The system of claim 18, wherein the consecutive idle periods include odd idle periods and even idle periods, and the controller is configured to:

assert the reset input during each of the odd idle periods; and assert the set input during each of the even idle periods.

25. The system of claim 18, further comprising:

a pad; and a receiver having an input and an output, wherein the input of the receiver is coupled to the pad, and the output of the receiver is coupled to the signal input of the latching circuit.

26. The system of claim 18, further comprising:

a pad; and a driver having an input and an output, wherein the input of the driver is coupled to the output of the signal path, and the output of the driver is coupled to the pad.

27. The system of claim 18, wherein the latching circuit is configured to output a logic one at the output of the latching circuit when the controller asserts the set input, and output a logic zero at the output of the latching circuit when the controller asserts the reset input.

28. A system, comprising:

a latching circuit having a signal input, a clock input, a set input, a reset input, and an output, wherein the latching circuit is configured to latch a logic value at the signal input on an edge of a clock signal input to the clock input when the set input and the reset input are de-asserted, and output the latched logic value at the output of the latching circuit;

a signal path having an input and an output, wherein the input of the signal path is coupled to the output of the latching circuit; and a controller coupled to the set input and the reset input of the latching circuit, wherein the controller has an indicator input, and the controller is configured to:

receive a mode indicator signal at the indicator input;

if the mode indicator signal has a first logic value, de-assert the set input and the reset input; and if the mode indicator signal has a second logic value, assert the set input for k of N consecutive idle periods, and assert the reset input for N-k of the N consecutive idle periods, wherein k is an integer equal to or greater than one, and N is an integer greater than k.

29. The system of claim 28, wherein the controller is configured to store a sequence of bits in a register, each of the bits in the sequence of bits corresponding to a respective one of the N consecutive idle periods in an idle mode, and wherein, for each one of the N consecutive idle periods, the controller is configured to:

assert the set input during the idle period if the corresponding bit in the sequence of bits has a first bit value; and assert the reset input during the idle period if the corresponding bit in the sequence of bits has a second bit value.

30. The system of claim 28, wherein the latching circuit is configured to output a logic one at the output of the latching circuit when the controller asserts the set input, and output a logic zero at the output of the latching circuit when the controller asserts the reset input.

31. A method for aging control in a system including a multiplexer and a signal path coupled to an output of the multiplexer, comprising:

in an active mode, instructing the multiplexer to select a first input of the multiplexer; and inputting a clock signal to the first input of the multiplexer; and in an idle mode, instructing the multiplexer to select a second input of the multiplexer;

inputting a control signal to the second input of the multiplexer; and alternately setting the control signal high and low over multiple consecutive idle periods.

32. The method of claim 31, further comprising inputting a data signal, a clock signal, a control signal, or an address signal to the first input of the multiplexer in the active mode.

33. The method of claim 31, wherein the signal path comprises a delay circuit.

34. The method of claim 33, wherein the delay circuit comprises delay buffers coupled in series.

35. The method of claim 31, wherein the consecutive idle periods include odd idle periods and even idle periods, and alternately setting the control signal high and low comprises:

setting the control signal low during each of the odd idle periods; and setting the control signal high during each of the even idle periods.

36. The method of claim 31, wherein the consecutive idle periods include odd idle periods and even idle periods, and alternately setting the control signal high and low comprises:

setting the control signal high during each of the odd idle periods; and setting the control signal low during each of the even idle periods.

37. A method for aging control, in a system including a multiplexer and a signal path coupled to an output of the multiplexer, comprising:

in an active mode, instructing the multiplexer to select a first input of the multiplexer; and inputting a clock signal to the first input of the multiplexer; and in an idle mode, instructing the multiplexer to select a second input of the multiplexer;

inputting a control signal to the second input of the multiplexer;

setting the control signal high for k of N consecutive idle periods; and setting the control signal low for N-k of the N consecutive idle periods;

wherein k is an integer equal to or greater than one, and N is an integer greater than k.

38. The method of claim 37, further comprising storing a sequence of bits in a register, each of the bits in the sequence of bits corresponding to a respective one of the N consecutive idle periods in the idle mode, and wherein:

setting the control signal high for k of N consecutive idle periods comprises, for each one of the N consecutive idle periods, setting the control signal high during the idle period if the corresponding bit in the sequence of bits has a first bit value; and setting the control signal low for N-k of the N consecutive idle periods comprises, for each one of the N consecutive idle periods, setting the control signal low during the idle period if the corresponding bit in the sequence of bits has a second bit value.

39. A system, comprising:

a multiplexer having a first input, a second input, a select input, and an output;

a signal path having an input and an output, wherein the input of the signal path is coupled to the output of the multiplexer;

a latching circuit having a signal input, a clock input, and an output, wherein the signal input is coupled to the output of the signal path, the clock input of the latching circuit is configured to receive a clock signal, and the latching circuit is configured to latch a logic value at the signal input on an edge of the clock signal, and output the latched logic value at the output of the latching circuit; and a controller coupled to the second input of the multiplexer and the select input of the multiplexer, wherein the controller has an indicator input, and the controller is configured to:

receive a mode indicator signal at the indicator input;

if the mode indicator signal has a first logic value, instruct the multiplexer to select the first input of the multiplexer; and if the mode indicator signal has a second logic value, instruct the multiplexer to select the second input of the multiplexer, output a control signal to the second input of the multiplexer, and alternately set the control signal high and low over multiple consecutive idle periods.

40. The system of claim 39, wherein the first input of the multiplexer is configured to receive a data signal, a command signal, or an address signal.

41. A system, comprising:

a multiplexer having a first input, a second input, a select input, and an output;

a signal path having an input and an output, wherein the input of the signal path is coupled to the output of the multiplexer;

a latching circuit having a signal input, a clock input, and an output, wherein the signal input is coupled to the output of the signal path, the clock input of the latching circuit is configured to receive a clock signal, and the latching circuit is configured to latch a logic value at the signal input on an edge of the clock signal, and output the latched logic value at the output of the latching circuit; and a controller coupled to the second input of the multiplexer and the select input of the multiplexer, wherein the controller has an indicator input, and the controller is configured to:

receive a mode indicator signal at the indicator input;

if the mode indicator signal has a first logic value, instruct the multiplexer to select the first input of the multiplexer; and if the mode indicator signal has a second logic value, instruct the multiplexer to select the second input of the multiplexer, output a control signal to the second input of the multiplexer, set the control signal high for k of N consecutive idle periods, and set the control signal low for N−k of the N consecutive idle periods, wherein k is an integer equal to or greater than one, and N is an integer greater than k.

42. The system of claim 41, wherein the first input of the multiplexer is configured to receive a data signal, a command signal, or an address signal.

* * * * *